(12) United States Patent
Tamura et al.

(10) Patent No.: US 11,335,772 B2
(45) Date of Patent: *May 17, 2022

(54) SEMICONDUCTOR DEVICE AND METHOD OF MANUFACTURING SEMICONDUCTOR DEVICE

(71) Applicant: FUJI ELECTRIC CO., LTD., Kanagawa (JP)

(72) Inventors: Takahiro Tamura, Matsumoto (JP); Yuichi Onozawa, Matsumoto (JP); Takashi Yoshimura, Matsumoto (JP); Hiroshi Takishita, Matsumoto (JP); Akio Yamano, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/997,886

(22) Filed: Aug. 19, 2020

(65) Prior Publication Data

US 2020/0381515 A1     Dec. 3, 2020

Related U.S. Application Data

(60) Continuation of application No. 16/358,705, filed on Mar. 20, 2019, now Pat. No. 10,756,182, which is a
(Continued)

(30) Foreign Application Priority Data

Jun. 17, 2015   (JP) .............................. JP2015-121751

(51) Int. Cl.
*H01L 29/08*  (2006.01)
*H01L 29/739*  (2006.01)
(Continued)

(52) U.S. Cl.
CPC ...... *H01L 29/0834* (2013.01); *H01L 21/2253* (2013.01); *H01L 21/263* (2013.01);
(Continued)

(58) Field of Classification Search
CPC .................................................. H01L 21/2253
See application file for complete search history.

(56) References Cited

U.S. PATENT DOCUMENTS 4,499,657 A   2/1985   Ooga
5,444,271 A   8/1995   Kuwahara
(Continued)

FOREIGN PATENT DOCUMENTS

CN   103946983 A   7/2014
CN   103946985 A   7/2014
(Continued)

OTHER PUBLICATIONS

Office Action issued for counterpart Chinese Application No. 201680003833.0, issued by the Chinese Patent Office dated Aug. 12, 2020.
(Continued)

*Primary Examiner* — Thao P Le

(57) ABSTRACT

Provided is a semiconductor device including a semiconductor substrate doped with impurities, a front surface-side electrode provided on a front surface side of the semiconductor substrate, a back surface-side electrode provided on a back surface side of the semiconductor substrate, wherein the semiconductor substrate has a peak region arranged on the back surface side of the semiconductor substrate and having one or more peaks of impurity concentration, a high concentration region arranged closer to the front surface than the peak region and having a gentler impurity concentration than the one or more peaks, and a low concentration region arranged closer to the front surface than the high
(Continued)

concentration region and having a lower impurity concentration than the high concentration region.

28 Claims, 17 Drawing Sheets

Related U.S. Application Data division of application No. 15/607,696, filed on May 30, 2017, now Pat. No. 10,304,928, which is a continuation-in-part of application No. PCT/JP2016/067935, filed on Jun. 16, 2016.

(51) Int. Cl.
| | | |
|---|---|---|
| H01L 29/12 | (2006.01) | |
| H01L 29/32 | (2006.01) | |
| H01L 29/36 | (2006.01) | |
| H01L 29/66 | (2006.01) | |
| H01L 29/861 | (2006.01) | |
| H01L 27/07 | (2006.01) | |
| H01L 21/265 | (2006.01) | |
| H01L 29/40 | (2006.01) | |
| H01L 21/225 | (2006.01) | |
| H01L 21/266 | (2006.01) | |
| H01L 21/324 | (2006.01) | |
| H01L 27/06 | (2006.01) | |
| H01L 29/10 | (2006.01) | |
| H01L 21/263 | (2006.01) | |
| H01L 21/322 | (2006.01) | |

(52) U.S. Cl.
CPC .......... *H01L 21/265* (2013.01); *H01L 21/266* (2013.01); *H01L 21/26506* (2013.01); *H01L 21/322* (2013.01); *H01L 21/324* (2013.01); *H01L 27/0664* (2013.01); *H01L 27/0727* (2013.01); *H01L 29/1095* (2013.01); *H01L 29/12* (2013.01); *H01L 29/32* (2013.01); *H01L 29/36* (2013.01); *H01L 29/407* (2013.01); *H01L 29/66136* (2013.01); *H01L 29/739* (2013.01); *H01L 29/7397* (2013.01); *H01L 29/8613* (2013.01)

(56) References Cited

U.S. PATENT DOCUMENTS

| | | | |
|---|---|---|---|
| 5,528,058 A | 6/1996 | Pike, Jr. | |
| 6,013,545 A | 1/2000 | Lee | |
| 6,198,139 B1 | 3/2001 | Ishida | |
| 6,200,838 B1 | 3/2001 | Inoue | |
| 6,274,914 B1 | 8/2001 | Park | |
| 9,012,980 B1 | 4/2015 | Schulze | |
| 9,484,221 B2 | 11/2016 | Schmidt | |
| 10,056,449 B2 | 8/2018 | Takishita | |
| 10,056,451 B2 | 8/2018 | Takashi | |
| 10,304,928 B2* | 5/2019 | Tamura | H01L 29/12 |
| 10,756,182 B2* | 8/2020 | Tamura | H01L 27/0664 |
| 11,038,020 B2* | 6/2021 | Fujimoto | H01L 29/1608 |
| 2002/0140032 A1 | 10/2002 | Cho | |
| 2004/0263703 A1 | 12/2004 | You | |
| 2005/0186745 A1 | 8/2005 | Lee | |
| 2005/0258486 A1 | 11/2005 | Yoon | |
| 2006/0081923 A1 | 4/2006 | Mauder | |
| 2006/0286753 A1 | 12/2006 | Barthelmess | |
| 2007/0000427 A1 | 1/2007 | Umeno et al. | |
| 2007/0108512 A1 | 5/2007 | Sedlmaier | |
| 2009/0184340 A1 | 7/2009 | Nemoto | |
| 2009/0267191 A1 | 10/2009 | Minato | |
| 2010/0087053 A1 | 4/2010 | Hille | |
| 2011/0265859 A1 | 11/2011 | Safir | |
| 2013/0001639 A1 | 1/2013 | Iwasaki et al. | |
| 2013/0075783 A1 | 3/2013 | Yamazaki et al. | |
| 2013/0249058 A1 | 9/2013 | Neidhart et al. | |
| 2014/0106490 A1 | 4/2014 | Kawamura | |
| 2014/0169045 A1* | 6/2014 | Ueno | H01L 29/7832 363/37 |
| 2014/0246755 A1 | 9/2014 | Yoshimura et al. | |
| 2014/0295627 A1 | 10/2014 | Sun | |
| 2014/0299915 A1 | 10/2014 | Kouno et al. | |
| 2014/0357026 A1 | 12/2014 | Kobayashi et al. | |
| 2015/0054025 A1 | 2/2015 | Lu | |
| 2015/0091053 A1 | 4/2015 | Sandow | |
| 2015/0179441 A1 | 6/2015 | Onozawa | |
| 2015/0214347 A1 | 7/2015 | Falck | |
| 2015/0270132 A1 | 9/2015 | Laven | |
| 2015/0311279 A1 | 10/2015 | Onozawa | |
| 2015/0311327 A1 | 10/2015 | Wu | |
| 2015/0371858 A1 | 12/2015 | Laven et al. | |
| 2016/0155794 A1 | 6/2016 | Kim | |
| 2016/0172438 A1 | 6/2016 | Jelinek | |
| 2016/0181104 A1 | 6/2016 | Schmidt | |
| 2016/0276446 A1 | 9/2016 | Wakimoto et al. | |
| 2016/0284825 A1 | 9/2016 | Onozawa | |
| 2016/0329401 A1 | 11/2016 | Laven | |
| 2017/0271447 A1 | 9/2017 | Tamura | |
| 2018/0122895 A1 | 5/2018 | Jelinek | |
| 2019/0027561 A1* | 1/2019 | Ohi | H01L 29/12 |
| 2019/0067462 A1* | 2/2019 | Tamura | H01L 29/36 |
| 2019/0157395 A1 | 5/2019 | Schulze | |
| 2020/0194562 A1* | 6/2020 | Yoshimura | H01L 29/06 |
| 2021/0226017 A1* | 7/2021 | Kubouchi | H01L 29/0834 |
| 2021/0265492 A1* | 8/2021 | Takishita | H01L 29/36 |
| 2021/0359088 A1* | 11/2021 | Ohi | H01L 29/7397 |

FOREIGN PATENT DOCUMENTS

| | | |
|---|---|---|
| JP | 2005322712 A | 11/2005 |
| JP | 2006344823 A | 12/2006 |
| JP | 2009-099705 A | 5/2009 |
| JP | 2009176892 A | 8/2009 |
| JP | 2012069861 A | 4/2012 |
| JP | 2013074181 A | 4/2013 |
| JP | 2013138172 A | 7/2013 |
| JP | 2014175517 A | 9/2014 |
| JP | 2016009868 A | 1/2016 |
| WO | 2005108656 A1 | 11/2005 |
| WO | 200796996 A1 | 8/2007 |
| WO | 2011125156 A1 | 10/2011 |
| WO | 2013100155 A1 | 7/2013 |
| WO | 2013141221 A1 | 9/2013 |
| WO | 2014065080 A1 | 5/2014 |
| WO | 2014208404 A1 | 12/2014 |
| WO | 2016051973 A1 | 4/2016 |
| WO | 2016204227 A1 | 12/2016 |

OTHER PUBLICATIONS

Office Action issued for counterpart Japanese Application No. 2018-053576, issued by the Japan Patent Office dated Feb. 5, 2019 (drafted on Jan. 29, 2019).

International Search Report for International Patent Application No. PCT/JP2016/067935, issued by the Japan Patent Office dated Aug. 2, 2016.

Office Action issued for counterpart Japanese Application 2017-525294, issued by the Japan Patent Office dated Dec. 5, 2017(drafted on Nov. 28, 2017).

Parent U.S. Appl. No. 15/607,696, filed May 30, 2017.

Parent U.S. Appl. No. 16/358,705, filed Mar. 20, 2019.

Notice of First Office Action for Patent Application No. 201680003833.0, issued by The Statel Intellectual Property Office of the People's Republic of China dated Nov. 21, 2019.

* cited by examiner

SEMICONDUCTOR DEVICE AND METHOD OF MANUFACTURING SEMICONDUCTOR DEVICE

CROSS-REFERENCE TO RELATED APPLICATIONS

This application is a continuation application of U.S. patent application Ser. No. 16/358,705, filed on Mar. 20, 2019, which is a divisional of U.S. patent application Ser. No. 15/607,696, filed on May 30, 2017, which is a continuation-in-part of International Application No. PCT/JP2016/067935 filed on Jun. 16, 2016, which claims priority to Japanese Patent Application No. 2015-121751 filed on Jun. 17, 2015, the contents of each of which are hereby incorporated herein by reference in their entirety.

BACKGROUND

1. Technical Field

The present invention relates to a semiconductor device and a method of manufacturing the semiconductor device.

2. Related Art

In the past, for a vertical semiconductor device in which a current is made to flow in the thickness direction of a semiconductor substrate, a configuration of a field stop layer being provided on the back surface side of the semiconductor substrate has been known (for example, see Patent Documents 1 and 2).
Patent Document 1: Japanese Patent Application Publication No. 2009-99705
Patent Document 2: WO 2013/100155

When a field stop layer is shallow, it is difficult to sufficiently suppress turn-off vibration and reverse recovery vibration of a transistor such as an IGBT.

SUMMARY

In a first aspect of the present invention, a semiconductor device is provided. The semiconductor device may include a semiconductor substrate doped with impurities. The semiconductor device may include a front surface-side electrode provided on a front surface side of the semiconductor substrate. The semiconductor device may include a back surface-side electrode provided on a back surface side of the semiconductor substrate. The semiconductor substrate may have a peak region arranged on the back surface side of the semiconductor substrate and having one or more peaks of impurity concentration. The semiconductor substrate may have a high concentration region arranged closer to the front surface than the peak region, and having a gentler distribution of the impurity concentration than the one or more peaks. The semiconductor substrate may have a low concentration region arranged closer to the front surface than the high concentration region and having a lower impurity concentration than the high concentration region.

The semiconductor substrate may have a drift region and the low concentration region may be included in the drift region. A length in a depth direction of the high concentration region may be longer than that of the peak region.

A carrier lifetime in the high concentration region may be longer than that in the low concentration region. The length in the depth direction of the high concentration region may be 5 µm or more. The maximum value of the impurity concentration in the high concentration region may be larger than or equal to 1.2 times the impurity concentration in the low concentration region. The impurity concentration of a peak of the one or more peaks that is closest to the front surface may be higher than $5 \times 10^{14}/cm^3$.

The high concentration region may have an increase part in which the impurity concentration increases from the back surface side toward the front surface side. The high concentration region may have a decrease part arranged closer to the front surface than the increase part and having the impurity concentration decreasing from the back surface side toward the front surface side. An absolute value of a decrease rate of the impurity concentration in the decrease part may be larger than the absolute value of the increase rate of the impurity concentration in the increase part.

The semiconductor substrate may be a MCZ substrate. An average oxygen concentration in the semiconductor substrate may be $1.0 \times 10^{16}/cm^3$ or more and $1.0 \times 10^{18}/cm^3$ or less.

The semiconductor substrate may further include a defect region formed to extend in the depth direction from the front surface of the semiconductor substrate. A part of the defect region and a part of the high concentration region may be formed at the same position in the depth direction.

A tip of the defect region may extend closer to the back surface of the semiconductor substrate than the peak provided closest to the front surface of the semiconductor substrate in the peak region. The tip of the defect region may be formed at the same position in the depth direction as any of the peaks in the peak region.

The semiconductor substrate may further include a defect region formed to extend in the depth direction from the back surface of the semiconductor substrate. The defect region may extend closer to the front surface of the semiconductor substrate than the high concentration region.

The semiconductor substrate may have a transistor region in which a transistor is formed and a diode region in which a diode is formed. The high concentration region may be formed in the diode region. The high concentration region may be formed also in the transistor region. The high concentration region may not be formed in the transistor region.

In a second aspect of the present invention, a method of manufacturing a semiconductor device is provided. The manufacturing method may include doping protons from a back surface side of a semiconductor substrate. The manufacturing method may include forming a defect region to extend in a depth direction of the semiconductor substrate. The manufacturing method may include annealing the semiconductor substrate after the doping protons and after the forming a defect region.

In the forming a defect region, the semiconductor substrate may be irradiated with an electron beam of 20 kGy or more and 1500 kGy or less. In the forming a defect region, an electron beam of 1200 kGy or less may be irradiated.

By implanting a defect generating substance at a predetermined depth of the semiconductor substrate from the front surface or the back surface of the semiconductor substrate in the forming a defect region, the defect region may be formed to extend from a front surface or a back surface of the semiconductor substrate to an implantation position of the defect generating substance.

The semiconductor substrate may have a transistor region in which a transistor is formed and a diode region in which a diode is formed. In the forming a defect region, the defect generating substance may be implanted by masking at least a part of the transistor region. A doping amount of the protons may be $1.0 \times 10^{14}/cm^2$ or more.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention. However, the following embodiments do not limit the claimed inventions. Also, all of combinations of features described in the embodiments are not necessarily essential for means for solving the problem of the invention.

Figure 1:
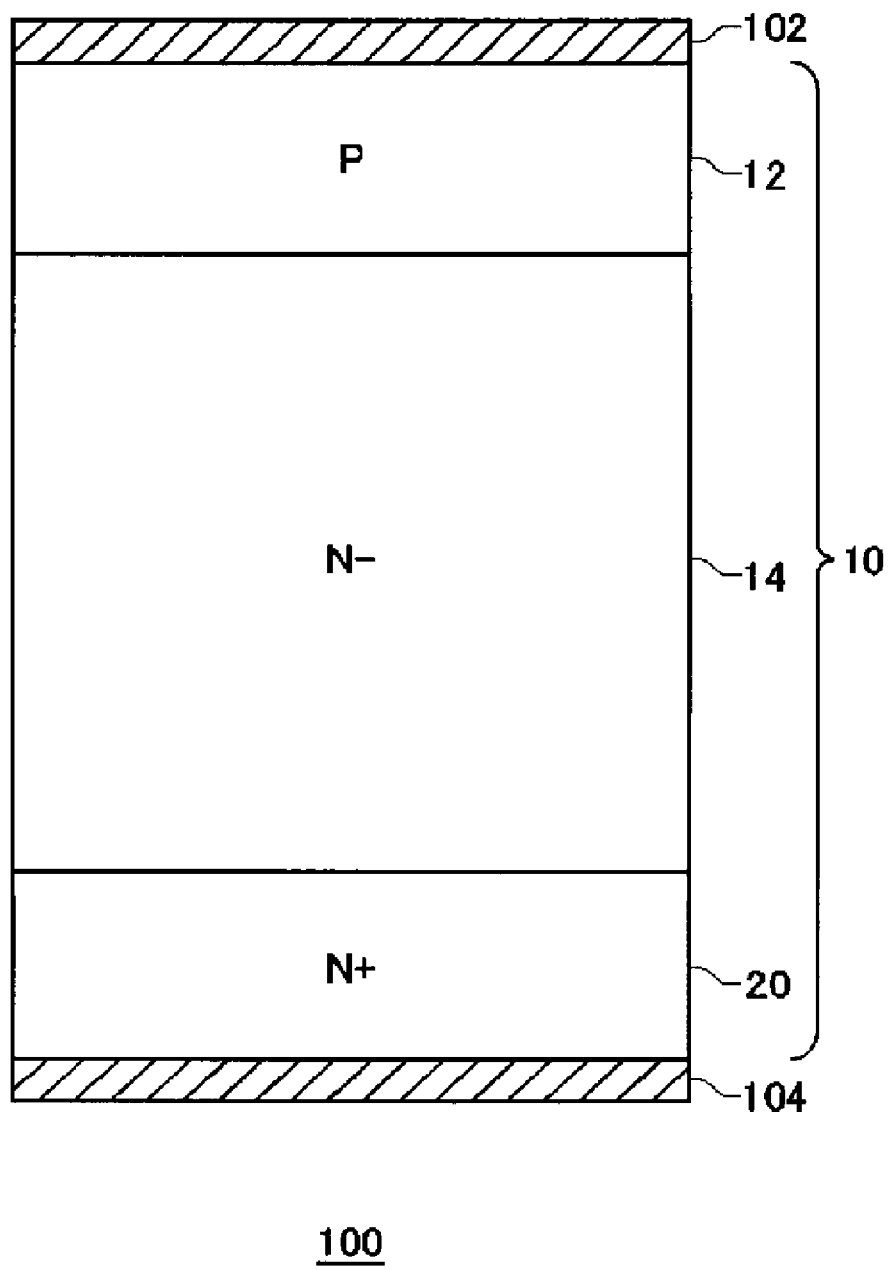
FIG. 1 shows a cross-sectional view illustrating the outline of a semiconductor device 100 according to a first embodiment of the present invention.

FIG. 1 shows a cross-sectional view illustrating the outline of a semiconductor device 100 according to a first embodiment of the present invention. The semiconductor device 100 is a vertical semiconductor device in which electrodes are formed on the front surface and the back surface of the semiconductor substrate 10, so that a current flows in the thickness direction of a semiconductor substrate 10. Although a free wheeling diode (FWD) is illustrated as an example of the semiconductor device 100 in FIG. 1, the semiconductor device 100 may be another semiconductor device which has a FS region 20 such as IGBT.

The semiconductor device 100 includes a semiconductor substrate 10, a front surface-side electrode 102, and a back surface-side electrode 104. The semiconductor substrate 10 is made of semiconductor material such as silicon or compound semiconductor. A predetermined concentration of impurities is doped into the semiconductor substrate 10. The conductivity type of the semiconductor substrate 10 of this example is N-type.

The semiconductor substrate 10 has a front surface-side region 12, a drift region 14 and a field stop region (FS region 20). The drift region 14 has the same conductivity type as the semiconductor substrate 10. In this example, the conductivity type of the drift region 14 is N-type. The front surface-side region 12 is formed on the front surface side of the semiconductor substrate 10 and is doped with impurities having a different conductivity type from the conductivity type of the drift region 14. In this example, the conductivity type of the front surface-side region 12 is P-type. When the semiconductor device 100 is a FWD, the front surface-side region 12 functions as an anode region.

The FS region 20 is formed on a back surface side of the semiconductor substrate 10. The FS region 20 has the same conductivity type as the drift region 14, and is doped with impurities at a higher concentration than the drift region 14. In this example, the FS region 20 is N+—type. A back surface-side region may be formed between the FS region 20 and the back surface-side electrode 104. When the semiconductor device 100 is a FWD, the back surface-side region functions as a cathode region. Providing a highly concentrated FS region 20 can prevent a depletion layer extending from an interface between the front surface-side region 12 and the drift region 14 from reaching the back surface-side region of the semiconductor substrate 10.

The front surface-side electrode 102 is provided on the front surface side of the semiconductor substrate 10. Although the front surface-side electrode 102 of this example has a planar shape, the front surface-side electrode 102 of another example may have a trench shape. When the semiconductor device 100 is a FWD, the front surface-side electrode 102 is an anode electrode. The back surface-side electrode 104 is provided on the back surface side of the semiconductor substrate 10. When the semiconductor device is a FWD, the back surface-side electrode 104 is a cathode electrode.

Figure 2A:
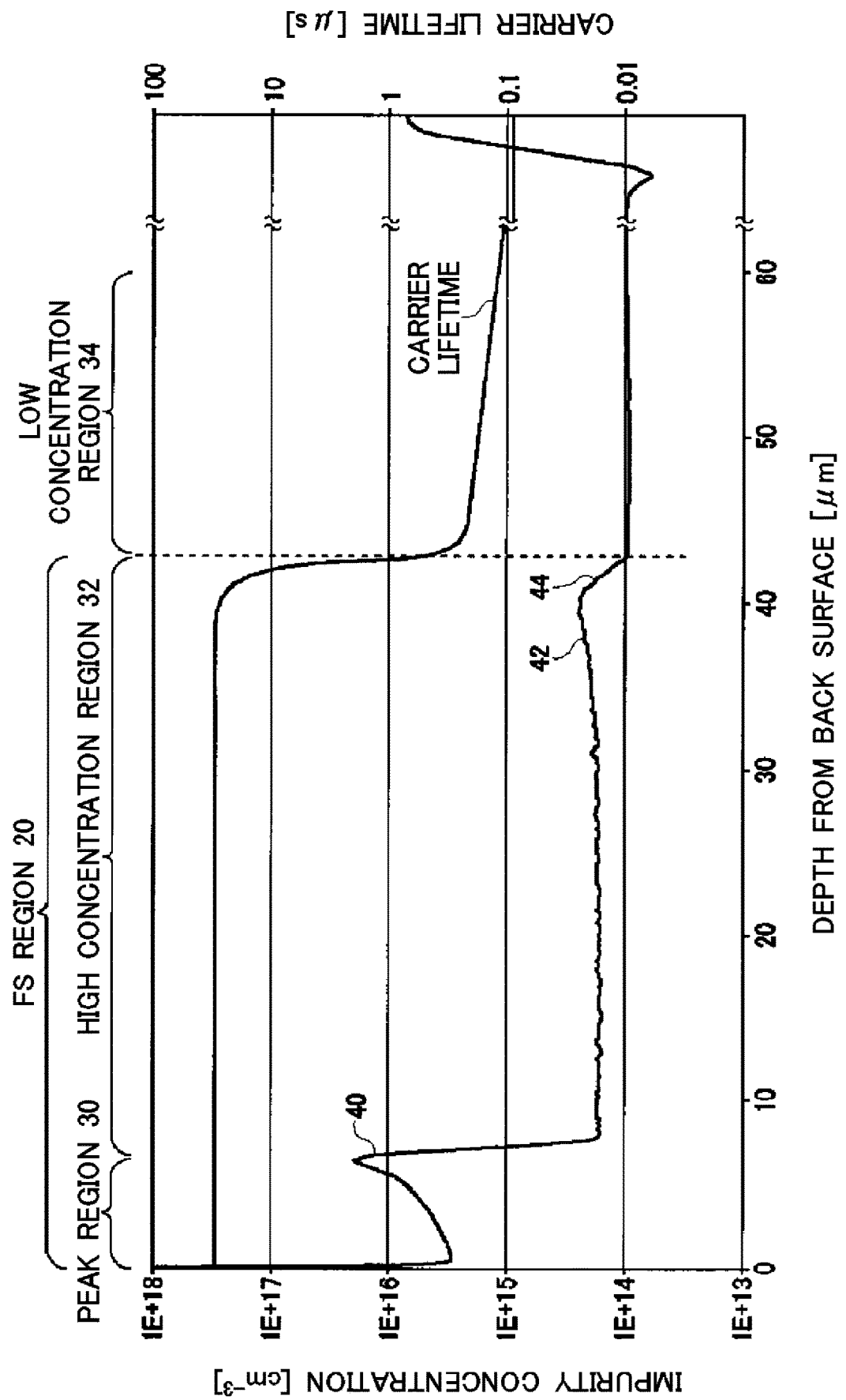
FIG. 2A shows a diagram illustrating examples of distributions of an impurity concentration and a carrier lifetime in a FS region 20 and a part of a drift region 14.

FIG. 2A shows a diagram illustrating examples of distributions of an impurity concentration and a carrier lifetime in a FS region 20 and a part of a drift region 14. In FIG. 2A, the lateral axis represents a depth from the back surface of the semiconductor substrate 10, and the left longitudinal axis represents an impurity concentration. Furthermore, the right longitudinal axis represents a carrier lifetime. Note that the peak of the impurity concentration near the depth of 0 μm corresponds to the back surface-side region such as the cathode region. The back surface-side region is formed by doping impurities such as for example, phosphorous from the back surface side of the semiconductor substrate 10.

The FS region 20 has a peak region 30 and a high concentration region 32 in order from the back surface side.

Furthermore, the drift region 14 has a low concentration region 34 in which the impurity concentration is lower than in the high concentration region 32. The entire drift region 14 may be the low concentration region 34. The peak region 30 is arranged, for example between the back surface and the center of the semiconductor substrate 10. The peak region 30 may be formed at a distance from the back surface side of the semiconductor substrate 10 in a predetermined range of 30 μm or less, in a predetermined range of 20 μm or less, or in a predetermined range of 10 μm or less.

A distribution of the impurity concentration in the peak region 30 has one or more peaks 40. The peaks 40 are formed by doping small-mass impurities such as protons from the back surface side of the semiconductor substrate 10. By using small-mass impurities such as protons, positions of the peaks 40 can be controlled with a good accuracy. It is preferable that the aforementioned impurity is a substance whose mass is smaller than phosphorous and selenium.

The high concentration region 32 is arranged closer to the front surface than the peak region 30. An impurity concentration of the high concentration region 32 is higher than the impurity concentration of the semiconductor substrate 10 (the impurity concentration of the drift region 14 in this example), and changes more gently than that of the peak region 30 (the peak 40 in this example) in the depth direction of the semiconductor substrate 10. The maximum value of the impurity concentration in the high concentration region 32 may be larger than or equal to 1.2 times, larger than or equal to 1.5 times, or larger than or equal to 2 times the impurity concentration in the low concentration region 34. Furthermore, the average value of the impurity concentration in the high concentration region 32 is larger than or equal to 1.1 times, or larger than or equal to 1.2 times the impurity concentration in the low concentration region 34. The above-described impurity concentration in the low concentration region 34 may be the average impurity concentration in the low concentration region 34.

Furthermore, the maximum value of inclination relative to the depth of the impurity concentration distribution of the high concentration region 32 may be smaller than the average value of inclinations of the impurity concentration distributions in the peaks 40. Furthermore, the maximum value of the impurity concentration in the high concentration region 32 is smaller than the maximum value of each peak 40 included in the peak region 30. In addition, the maximum value of the impurity concentration in the high concentration region 32 may be smaller than the minimum value in the impurity concentration in the peak region 30.

Furthermore, the high concentration region 32 may be longer than one peak 40 in the depth direction. Furthermore, the high concentration region 32 may be longer than the entire peak region 30 in the depth direction. Note that a boundary between the high concentration region 32 and the peak region 30 may be the point at which the impurity concentration exhibits the local minimum value for the first time after the peak 40. Furthermore, the boundary between the high concentration region 32 and the peak region 30 may be the point at which an amount of change in the impurity concentration with respect to the depth direction becomes a predetermined value or less after the peak 40. For example, the point at which the change in the impurity concentration becomes 20% or less relative to the impurity concentration at the distance in the depth direction of 1 μm in the region closer to the front surface than the peak 40 may be defined as the boundary of the high concentration region 32 on the back surface side. Furthermore, the boundary between the high concentration region 32 and the low concentration region 34 may be the point at which the impurity concentration becomes the average impurity concentration of the drift region 14.

When the peak region 30 has a plurality of peaks 40, the high concentration region 32 is longer than the width of any of the peaks 40. The width of the peak 40 refers to the width between two local minimum values of the impurity concentration. In addition, even when the peak region 30 has a plurality of peaks 40, the high concentration region 32 may be longer than the entire peak region 30.

The low concentration region 34 is arranged closer to the front surface than the high concentration region 32. The impurity concentration in the low concentration region 34 is lower than that in the high concentration region 32. The impurity concentration in the low concentration region 34 may be the same as that in the semiconductor substrate 10.

The high concentration region 32 is formed by forming a defect region extending in the depth direction of the semiconductor substrate 10 after or before impurities such as protons are doped under a predetermined condition to produce the peak 40, and after the proton doping and the defect region formation, by performing a heat treatment. The density of crystal defects of the defect region is higher than those of the other regions of the semiconductor substrate 10. The defect region is formed in at least a part of the region in which the high concentration region 32 should be formed. The defect region may be formed in the same region as the high concentration region 32 should be formed, or may be formed in a wider region than the high concentration region 32 should be formed. A relatively large number of crystal defects exist in the defect region, which makes it easier for impurities such as protons to diffuse to a deep position.

As an example, the defect region can be formed by irradiating the semiconductor substrate 10 with an electron beam under a predetermined condition. The crystal defects are formed in the region closer to the front surface than the peak region 30 by irradiating the semiconductor substrate 10 with an electron beam under a predetermined condition. With the subsequent heat treatment, impurities such as protons doped in the peak region 30 diffuse on the front surface side.

With such a process, the high concentration region 32 which is gentler than the peak region 30 can be formed. Therefore, dv/dt and overshoot voltage can be suppressed during a reverse recovery. Thereby, the voltage and current waveforms during switching can be made smooth.

For the high concentration region 32, the length in the depth direction may be 5 μm or more. The length of the high concentration region 32 refers to the length from the boundary with the peak region 30 to the boundary with the low concentration region 34. Furthermore, the length of the high concentration region 32 may be 10 μm or more, 20 μm or more, or 30 μm or more. The length of the high concentration region 32 can be controlled by doping amount of impurities such as protons, a range where the defect region is formed, a density of crystal defect in the defect region or the like. When the defect region is formed by irradiating with an electron beam, the length of the high concentration region 32 can be controlled by an irradiation dose of the electron beam, heat treatment temperature or time after electron beam irradiation, or the like.

Furthermore, because the crystal defect in the defect region that is formed by the electron beam or the like is recovered by diffusion of impurities such as protons, the carrier lifetime on the front surface side of the semiconductor substrate can be shortened, and the carrier lifetime on the back surface side can be extended. Specifically, hydrogen is introduced into a range region of the semiconductor substrate 10 by implanting protons. The introduced hydrogen diffuses from the range region to the deeper side of the semiconductor substrate 10 (in this case, the front surface side) through further heat treatment. The hydrogen introduced in this way can terminate dangling bond due to point defects formed by the electron beam irradiation or the like. Thereby, point defect concentration decreases and the carrier lifetime increases. For this reason, a peak current Irp and dv/dt during a reverse recovery can be decreased at the same time.

In this example, the carrier lifetime in the high concentration region 32 is longer than that in the low concentration region 34. The distribution of the carrier lifetime has an edge at which the lifetime transits from a long lifetime to a short lifetime at the boundary between the high concentration region 32 and the low concentration region 34. Note that the carrier lifetime in the high concentration region 32 is almost constant, and the carrier lifetime in the low concentration region 34 may decrease gradually toward the front surface side.

The peak region 30 and the high concentration region 32 is considered as a region in which donors due to vacancy-oxygen-hydrogen defects (VOH defects) by vacancy (V) introduced by implanting protons, irradiating with the electron beam or the like, oxygen (O) mixed during fabrication of the semiconductor substrate 10 or introduced during an element forming process, and implanted hydrogen (H) are formed. The donors due to the VOH defects have a donor activation rate of being activated at a rate in the range of 0.1%-10% relative to the implantation amount of the introduced hydrogen or the concentration of hydrogen. The peak region 30 exhibits a donor concentration distribution (net doping concentration distribution) of the VOH defects in which the concentration distribution of the implanted hydrogen is reflected because a concentration distribution obtained by multiplying the hydrogen concentration distribution by the donor activation rate is sufficiently higher than the phosphorous concentration of the semiconductor substrate 10.

On the other hand, because the high concentration region 32 is a region deeper than the range of the implanted proton, Rp, the high concentration region 32 is a region in which hydrogen diffuses from the range Rp, to the deeper side of the semiconductor substrate 10 (in this case, the front surface side). In this case, the value obtained by multiplying the concentration distribution of the diffused hydrogen by the donor activation rate is smaller than the phosphorous concentration of the semiconductor substrate 10. On the other hand, the point defect concentration is distributed generally uniformly in a predetermined region deeper than the proton range Rp by the electron beam irradiation or the like. Therefore, the diffused hydrogen is bound to vacancy and oxygen to form the VOH defects. If this donor concentration as the VOH defects exceeds the phosphorous concentration of the semiconductor substrate 10, the high concentration region 32 can be formed. In doing so, because oxygen and a small amount of diffused hydrogen are bounded to a generally uniform distribution of the vacancy concentration, the concentration distribution of the VOH defects becomes generally uniform. In the other words, for the donor concentration distribution of the high concentration region 32, the concentration distribution of the vacancy is dominant.

Note that as shown in FIG. 2A, an impurity concentration distribution in the high concentration region 32 has an increase part 42 in which an impurity concentration increases from the back surface side toward the front surface side around the boundary with the low concentration region 34, and a decrease part 44 arranged closer to the front surface than the increase part 42 and having an impurity concentration which decreases from the back surface side toward the front surface side.

Because the doped impurities such as protons diffuse into the peak region 30, the high concentration region 32 has the impurity concentration distribution corresponding to the impurity concentration distribution in the peak region 30. In this example, as a result of the diffusion of impurities such as protons doped at a position of the peak 40, the increase part 42 and the decrease part 44 appear in both ends of the high concentration region 32. Furthermore, because the distribution of the impurity concentration is averaged in the process of diffusion of impurities such as protons, the distribution of the impurity concentration in the high concentration region 32 becomes gentler than that in the peak region 30.

In this example, because the shape of the increase part 42 and the decrease part 44 depend on the shape of the peaks 40, the absolute value of a decrease rate of the impurity concentration in the decrease part 44 is larger than the absolute value of an increase rate of the impurity concentration in the increase part 42. In other words, the impurity concentration changes more sharply in the decrease part 44 than in the increase part 42. The distance between the peak 40 and the boundary between the increase part 42 and the decrease part 44 may be 10 μm or more, 20 μm or more, or 30 μm or more. In this example, the position of the peak 40 is at a position of about 7 μm from the back surface of the semiconductor substrate 10, a position of the boundary between the increase part 42 and the decrease part 44 is at a position of about 40 μm from the back surface of the semiconductor substrate 10.

Figure 2B:
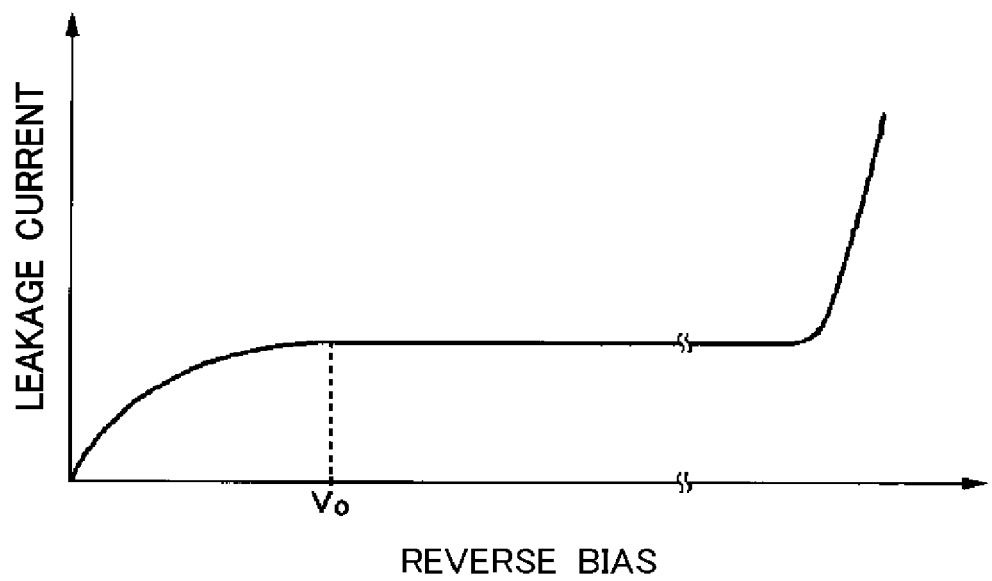
FIG. 2B shows a diagram illustrating a measurement method of the carrier lifetime in the semiconductor device 100.

FIG. 2B shows a diagram illustrating a measurement method of the carrier lifetime in the semiconductor device 100. In this example, a defect region is formed by an electron beam irradiation. FIG. 2B shows the relationship between a reverse bias voltage and leakage current in the semiconductor device 100. Crystal defects are formed by the electron beam irradiation in the low concentration region 34. In addition, the defects do not disappear even with impurities such as protons. For this reason, the leakage current increases gradually as the reverse bias increases from 0 V.

On the other hand, the crystal defects in the high concentration region 32 decreases as compared with that in the low concentration region 34 because dangling bonds of the defects are terminated by hydrogen due to the diffusion of impurities such as protons. For this reason, the leakage current does not increase any more even if a reverse bias is increased to be higher than a predetermined voltage Vo for the position of the boundary between the low concentration region 34 and the high concentration region 32. However, if a very large reverse bias is applied, a leakage current increases drastically due to avalanche breakdown.

As described above, the position of the boundary between the high concentration region 32 and the low concentration region 34 can be estimated by measuring the reverse bias voltage Vo at which the leakage current does not change any more. Note that the relationship between the voltage Vo and the position of the boundary $x_0$ is given by the following formula.

$$x_0 = \sqrt{\frac{2\varepsilon_r\varepsilon_0 V_0}{qN_D}}$$

Figure 3:
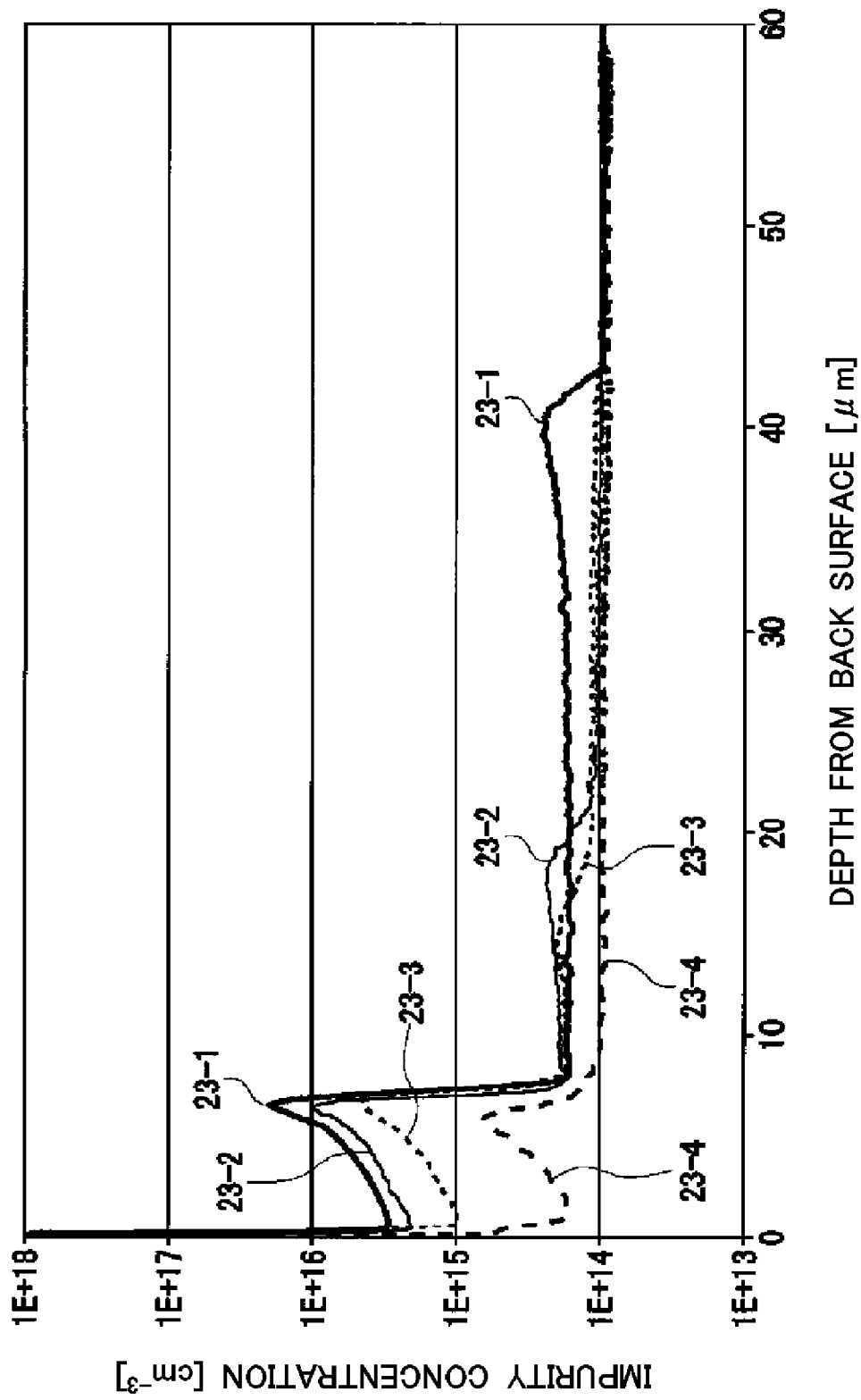
FIG. 3 shows a diagram illustrating another example of the distribution of the impurity concentration.

FIG. 3 shows a diagram illustrating another example of the distribution of the impurity concentration. In this example, protons are used as impurities doped into the peak region 30, and an electron beam irradiation is used to form the defect region. Furthermore, in this example, distributions of impurity concentration 23-1, 23-2, 23-3, and 23-4 for respective four doping amounts of protons are shown.

For the respective examples of the distributions, an accelerating voltage to accelerate protons is 550 keV, an annealing temperature and an annealing time after proton doping are 370° C. and 5 hours, respectively, an electron beam irradiation dose is 800 kGy, and an annealing temperature and an annealing time after electron beam irradiation are 360° C. and one hour, respectively. Furthermore, doping amounts of the protons are $1.0 \times 10^{15}/cm^2$ for distribution 23-1, $3.0 \times 10^{14}/cm^2$ for distribution 23-2, $1.0 \times 10^{14}/cm^2$ for distribution 23-3 and $1.0 \times 10^{13}/cm^2$ for distribution 23-4.

As shown in FIG. 3, it can be understood that the high concentration region 32 closer to the front surface than the peak region 30 becomes long as the doping amount of the protons increases. Note that the high concentration region 32 does not appear in distribution 23-4 for the case of relatively small doping amount of the protons of $1.0 \times 10^{13}/cm^2$. For this reason, it is preferable that the doping amount of the protons is $1.0 \times 10^{14}/cm^2$ or more. Furthermore, if the doping amount of the protons is $1.0 \times 10^{14}/cm^2$ or more, impurity concentration in the high concentration region 32 is almost the same. From this, it is preferable that the doping amount of the protons is $1.0 \times 10^{14}/cm^2$ or more.

Furthermore, as understood by distribution 23-1 and distribution 23-2, the high concentration region 32 extends efficiently when the doping amount of the protons is changed from $3.0 \times 10^{14}/cm^2$ to $1.0 \times 10^{15}/cm^2$. For this reason, the doping amount of the protons may be larger than $3.0 \times 10^{14}/cm^2$, or may be $1.0 \times 10^{15}/cm^2$ or more.

Figure 4:
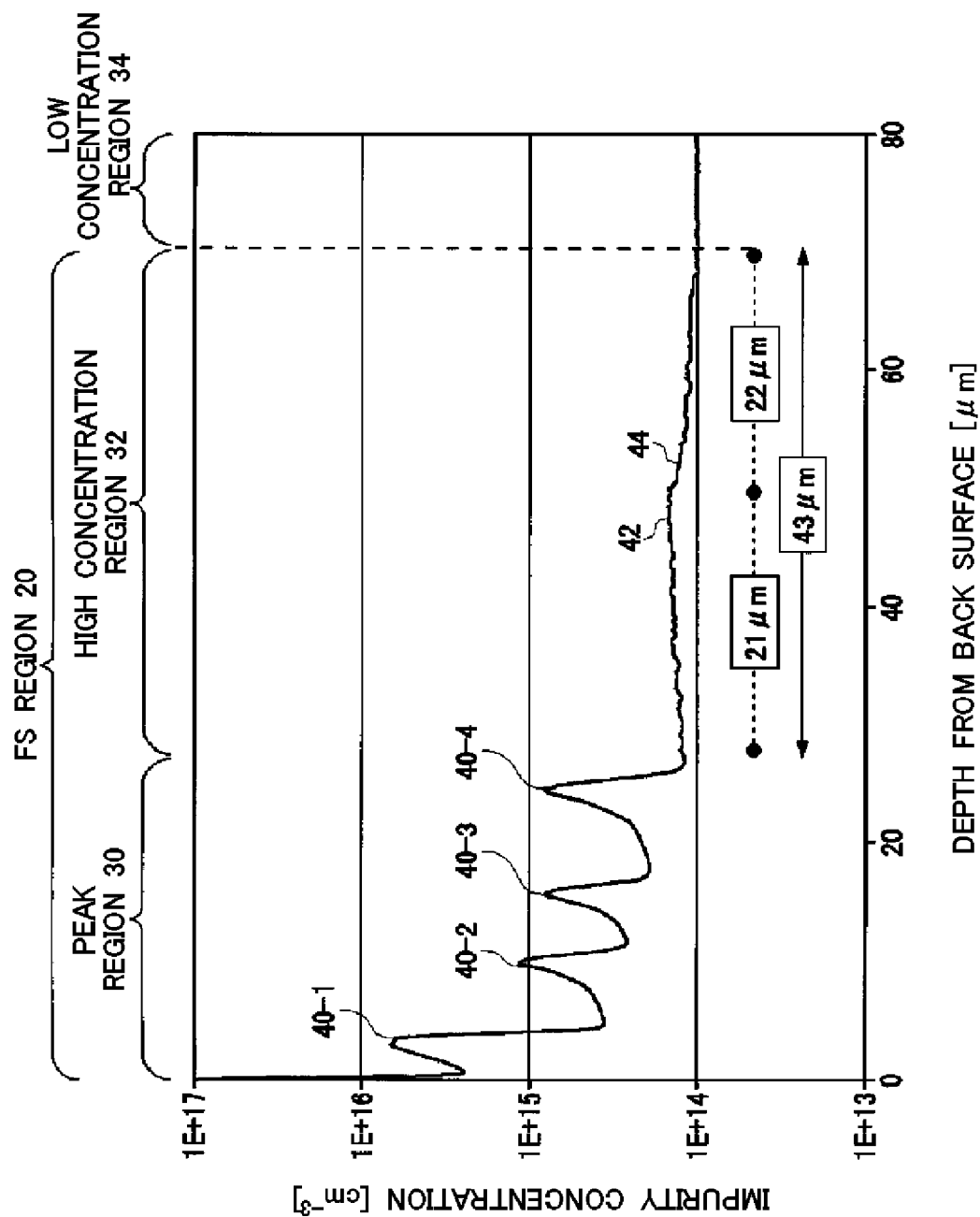
FIG. 4 shows a diagram illustrating another example of the distribution of the impurity concentration.

FIG. 4 shows a diagram illustrating another example of the distribution of the impurity concentration. In this example, a plurality of peaks 40 is provided in the peak region 30. As an example, peaks 40-1, 40-2, 40-3 and 40-4 are provided in order from the back surface side of the peak region 30.

The peak 40 of the plurality of peaks 40 that is closest to the front surface may have a higher impurity concentration than the peak 40 which is closer to the back surface by one than the aforementioned peak 40. In this example, the impurity concentration of peak 40-4 is higher than that of peak 40-3. Note that the impurity concentration of peak 40-1 is higher than that of any other peak 40. Furthermore, the impurity concentration of peak 40-2 is higher than that of peak 40-3. With such a configuration, the impurity concentration can be made to be high at a deep position of the high concentration region 32.

The impurity concentration of the peak 40 closest to the front surface may be higher than $5 \times 10^{14}/cm^3$. Alternatively, the impurity concentration of the peak 40 closest to the front surface may be higher than $1.2 \times 10^{15}/cm^3$ or higher than $1.4 \times 10^{15}/cm^3$.

Also in this example, the impurity concentration distribution of the high concentration region 32 has the increase part 42 and the decrease part 44. However, because the peak region 30 has a plurality of peaks 40, the diffusion of protons in the depth direction of the high concentration region 32 is homogenized. For this reason, the boundary between the increase part 42 and the decrease part 44 is arranged near the center of the high concentration region 32. In this example, the length of the high concentration region 32 is about 43 μm, the boundary between the increase part 42 and the decrease part 44 is arranged at a depth of about 21 μm-22 μm from the both ends of the high concentration region 32, respectively.

Note that in this example, a doping amount of the protons and an accelerating voltage for peak 40-1 are $3.0 \times 10^{14}/cm^2$ and 400 keV, respectively, a doping amount of the protons and an accelerating voltage for peak 40-2 are $1.0 \times 10^{13}/cm^2$ and 820 keV, respectively, a doping amount of the protons and an accelerating voltage for peak 40-3 are $7.0 \times 10^{12}/cm^2$ and 1110 key, respectively, and a doping amount of the protons and an accelerating voltage for peak 40-4 are $1.0 \times 10^{13}/cm^2$ and 1450 keV, respectively. Furthermore, an annealing temperature, an annealing time and an electron beam irradiation dose after proton doping are 370° C., 5 hours and 160 kGy, respectively, and an annealing temperature and an annealing time after electron beam irradiation are 360° C. and one hour, respectively.

Figure 5:
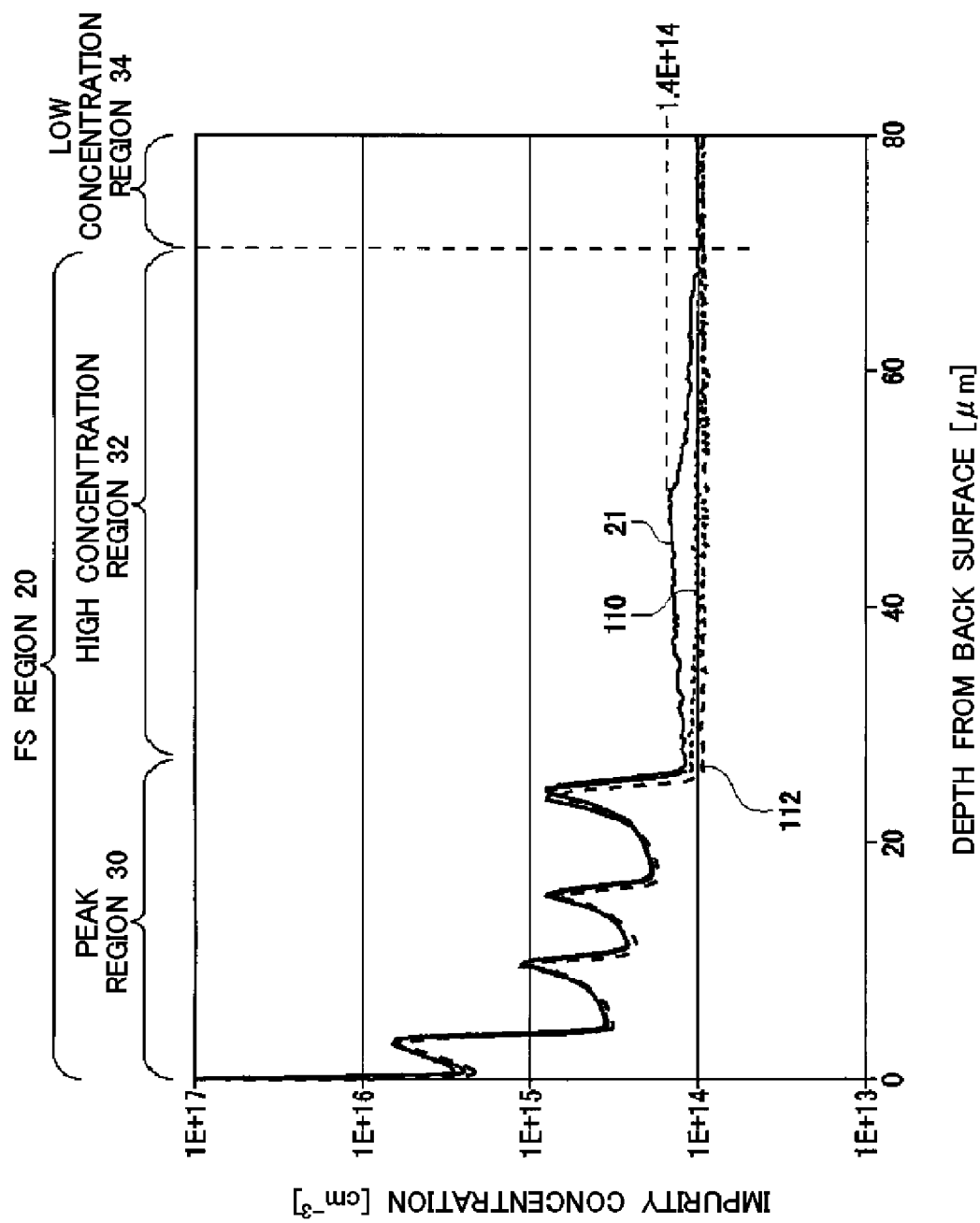
FIG. 5 shows a diagram illustrating a comparative example of the impurity concentration distributions for the case where an electron beam irradiation is performed and for the case where an electron beam irradiation is not performed.

FIG. 5 shows a diagram illustrating a comparative example of the impurity concentration distributions for the case where an electron beam irradiation is performed and for the case where an electron beam irradiation is not performed. Distribution 21 is a distribution under the same conditions as those for the distribution shown in FIG. 4. Distribution 110 is a distribution for the case where an electron beam irradiation is not performed after protons are doped and annealing is conducted. For distribution 110, the conditions are the same as those for distribution 21 except that the electron beam irradiation is not performed. Distribution 112 is a distribution for the case where helium is doped from the back surface of the semiconductor substrate 10 in place of the electron beam irradiation. For distribution 112, the conditions are the same as those for distribution 21 except that helium is doped in place of the electron beam irradiation. Note that helium is implanted from the back surface of the semiconductor substrate 10 into a position further shallower than the shallowest peak 40 as viewed from the back surface of the semiconductor substrate 10. As an example, helium was doped under the condition of 700 keV and $2.4 \times 10^{12}/cm^2$.

As shown in FIG. 5, in the distribution 110 for the case where the electron beam irradiation is not performed and the distribution 112 for the case where helium is doped in place of the electron beam irradiation, the high concentration region 32 is not formed. In contrast, in distribution 21 for the case where annealing is conducted after the electron beam irradiation, the high concentration region 32 is formed. It can be understood that the high concentration region 32 can be formed by conducting electron beam irradiation and annealing under a predetermined condition. Note that the maximum value of the impurity concentration in the high concentration region 32 in distribution 21 is $1.4 \times 10^{14}/cm^3$. Furthermore, the average value of the impurity concentration in the low concentration region 34 is $1.0 \times 10^{14}/cm^3$.

Figure 6:
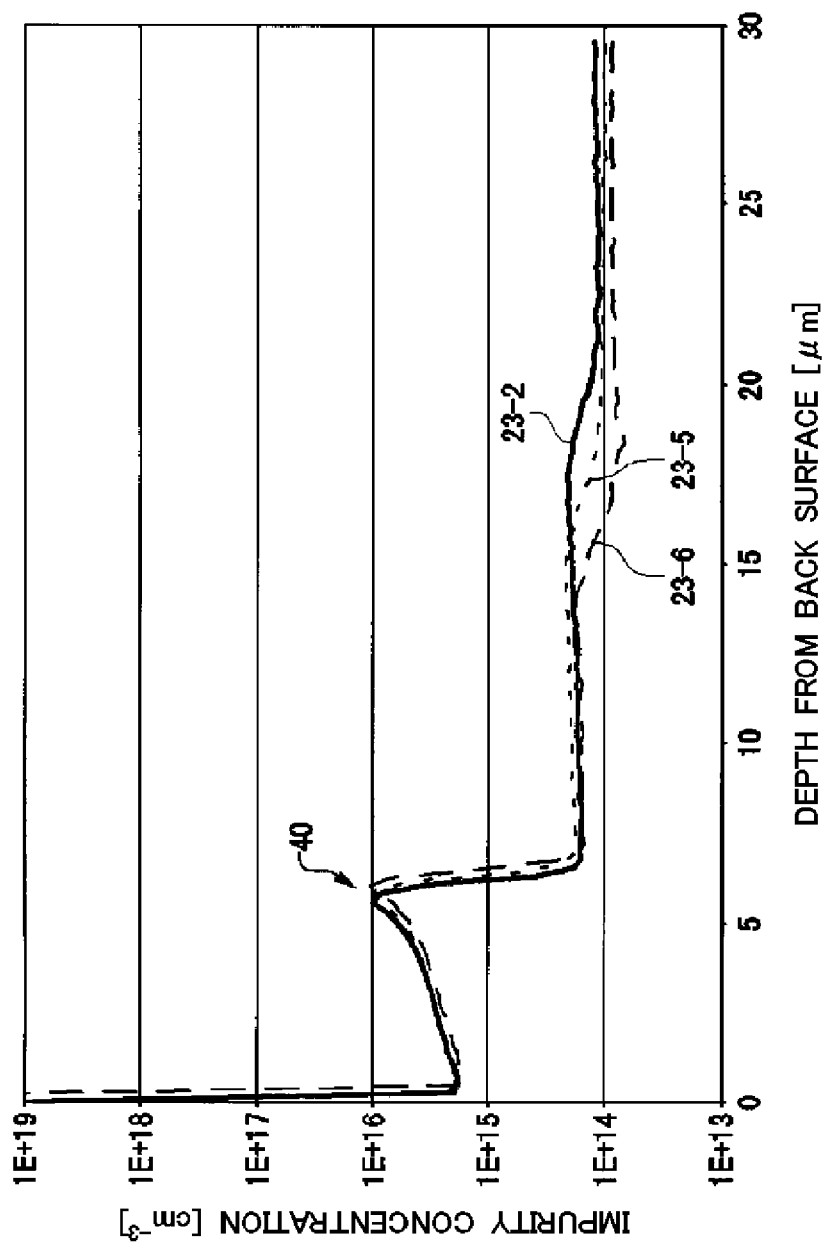
FIG. 6 shows a diagram illustrating an example of the distribution of the impurity concentration for the case where a condition of the electron beam irradiation is changed.

FIG. 6 shows a diagram illustrating an example of the distribution of the impurity concentration for the case where a condition of the electron beam irradiation is changed. Distribution 23-2 is the same as distribution 23-2 shown in FIG. 3. Distribution 23-5 is an example in which the electron beam irradiation dose is changed to 800 kGy, and distribution 23-6 is an example in which the electron beam irradiation dose is changed to 1200 kGy. Conditions except the electron beam irradiation dose for distribution 23-5 and distribution 23-6 are the same as those for distribution 23-2.

As shown in FIG. 6, the high concentration region 32 shortens as the electron beam irradiation dose increases. To form the high concentration region 32 having the length of 5 μm or more, it is preferable that the electron beam irradiation dose is 1500 kGy or less. The electron beam irradiation dose may be 1200 kGy or less, or 800 kGy or less. Note that it is preferable that the electron beam irradiation dose is 20 kGy or more to control the carrier lifetime. The electron beam irradiation dose may be adjusted according to the accelerating voltage of protons.

Figure 7:
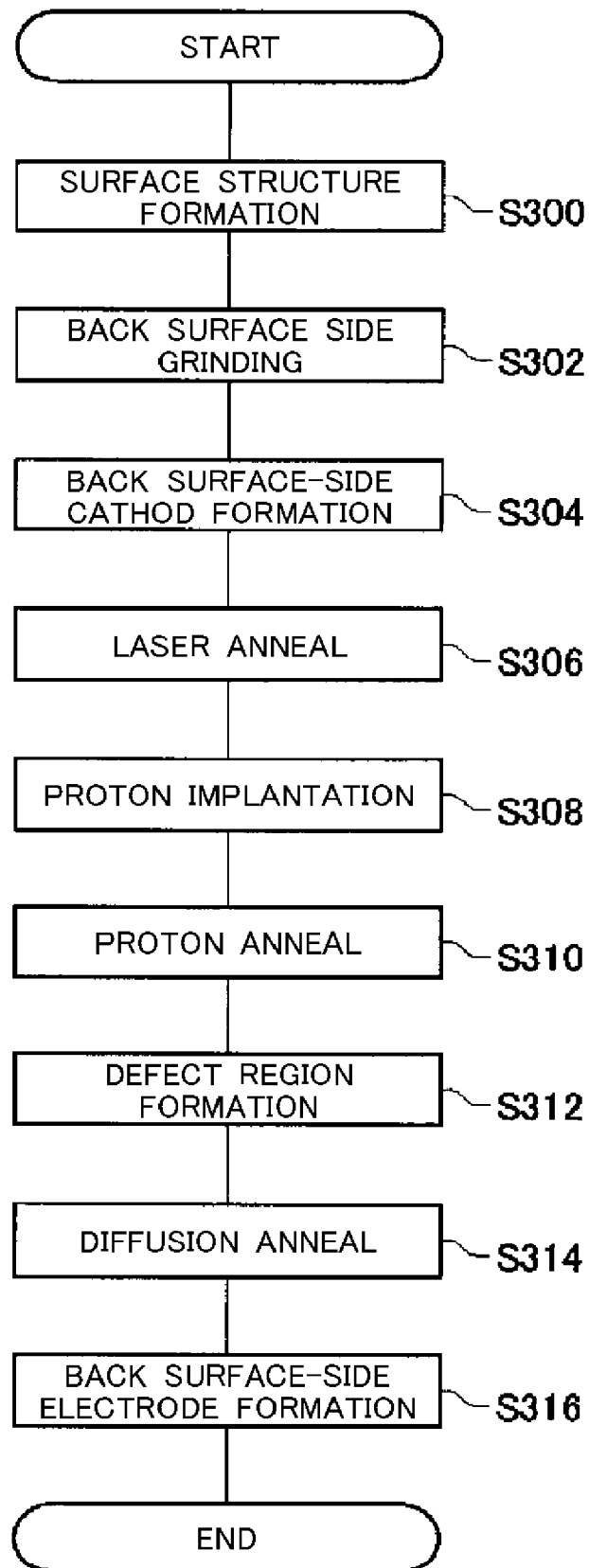
FIG. 7 shows a diagram illustrating an example of a manufacturing method of the semiconductor device 100.

FIG. 7 shows a diagram illustrating an example of a manufacturing method of the semiconductor device 100. At the beginning, a base substrate is provided, and front surface structures such as a front surface-side region 12 and a front surface-side electrode 102 are formed on the front surface side of the base substrate (S300). Then, a semiconductor substrate 10 is formed by grinding the back surface side of the base substrate to have the substrate thickness according to breakdown voltage (S302).

Then, a cathode region is formed by shallowly doping impurities such as phosphorous from the back surface side of the semiconductor substrate 10 (S304). After doping impurities, the cathode region is annealed by laser or the like (S306).

Then, protons are doped at a position deeper than the cathode region from the back surface side of the semiconductor substrate 10 (S308). In the step S308, protons may be doped at one or more depth positions. After doping protons, the semiconductor substrate 10 is annealed under a predetermined condition (S310). Thereby, a peak region 30 having one or more peaks 40 is formed. Note that the steps S312 and S314 may be conducted between the step S306 and the step S308. In other words, the electron beam irradiation may be conducted after or before the proton implantation.

Then, a defect region extending in the semiconductor substrate 10 in the depth direction is formed (S312). In the step S312, the defect region may be formed by irradiating an electron beam as described above. In this case, the defect region is formed to extend over the entire semiconductor substrate 10 in the depth direction. The electron beam may be irradiated from the back surface side or the front surface side of the semiconductor substrate 10. After forming the defect region, the semiconductor substrate 10 is annealed under a predetermined condition (S314). Thereby, a high concentration region 32 is formed.

Then, a back surface-side electrode 104 is formed on the back surface side of the semiconductor substrate 10. Thereby, the semiconductor device 100 can be manufactured. Note that a step of forming a floating region may be further included between the step S304 and the step S306. In the aforementioned step, a predetermined mask pattern may be formed on the back surface side of the semiconductor substrate 10 to dope impurities such as boron into the region which is not covered by the mask pattern.

Furthermore, a step of doping helium from the back surface side of the semiconductor substrate 10 may be further included between the step S310 and the step S312. In the aforementioned step, helium is doped at a predetermined depth position within the peak region 30 to regulate the carrier lifetime.

Through such a method, the high concentration region 32 can be formed to a deep position of the semiconductor substrate 10. Furthermore, the high concentration region 32 in which the concentration is relatively uniform can be formed. A highly concentrated impurity region may be formed at a deep position of the semiconductor substrate 10 by accelerating small-mass impurities such as protons at a high voltage, however, an expensive apparatus is needed in this case. In contrast, with the manufacturing method of this example, the formation of the high concentration region can be achieved with a simple apparatus because protons may be doped at a relatively shallow position.

In the above-described examples, the defect region is formed by irradiating the semiconductor substrate 10 with an electron beam. However, the formation of the defect region may be conducted using a method other than an electron beam irradiation. For example, the defect region can be formed by implanting a defect generating substance into the semiconductor substrate 10. A defect generating substance is a substance which can generate crystal defects in the region in the semiconductor substrate 10 through which the aforementioned substance passes. As an example, the defect generating substance is helium.

Furthermore, in the above-described examples, helium to be doped from the back surface side of the semiconductor substrate 10 was implanted from the back surface of the semiconductor substrate 10 at a range further shallower than the range of the protons implanted at the shallowest peak position from the back surface of the semiconductor substrate 10. Alternatively, helium ions may be implanted at a range further deeper than the range of the protons implanted at the deepest peak position from the back surface of the semiconductor substrate 10. The crystal defects are formed in the region through which helium ions implanted from the back surface of the semiconductor substrate 10 pass. For this reason, the defect region extending from the back surface of the semiconductor substrate 10 can be formed.

Figure 8:
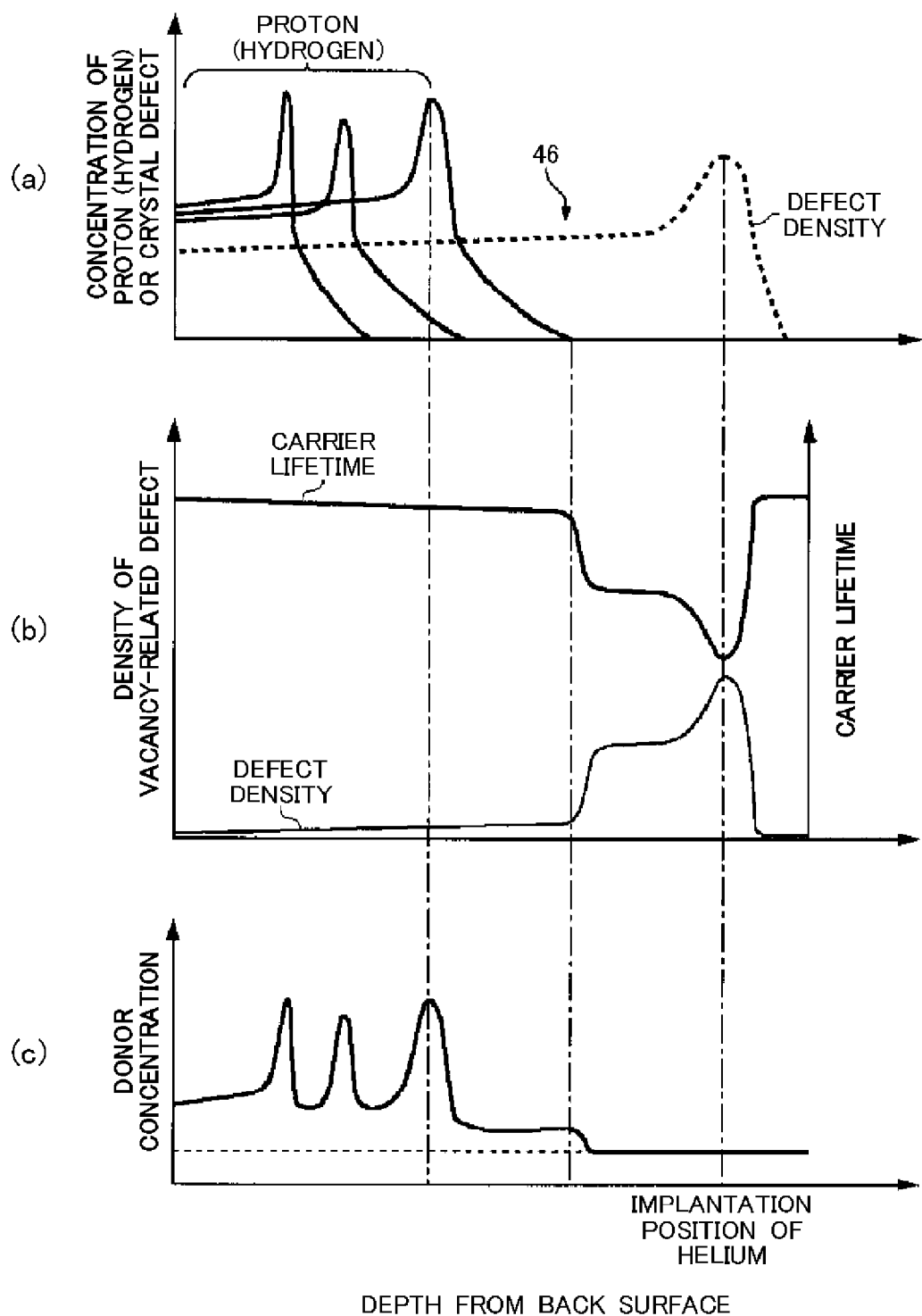
FIG. 8 shows a diagram illustrating an example in which helium ions are implanted deeper into the semiconductor substrate than the protons at the deepest position.

FIG. 8 shows a diagram illustrating an example in which helium ions are implanted deeper than the protons at the deepest position from the back surface side of the semiconductor substrate 10. Graph (a) of FIG. 8 is a distribution map illustrating a concentration distribution of protons (hydrogen) and a density distribution of crystal defects relative to a depth from the implantation surface (the back surface of the semiconductor substrate 10 in this example). The protons may be implanted into a plurality of peak positions. The protons are implanted in plural times for each peak position.

For graph (a) of FIG. 8, the number of times of peak implantation of protons is three, and hydrogen concentration distributions for respective implantations are described separately. Furthermore, helium is implanted into a single implantation position. Alternatively, helium may be implanted in plural times into different positions although it is not shown.

As shown in graph (a) of FIG. 8, a defect region 46 extending from the back surface of the semiconductor substrate 10 is formed by passage of helium. Note that the defect density distribution in the defect region 46 has a peak near the implantation position of helium. Because protons tend to diffuse in the defect region 46, the protons can be diffused on the front surface side of the semiconductor substrate 10 by annealing the semiconductor substrate 10 after implanting protons and helium.

Graph (b) of FIG. 8 is a distribution map illustrating the density distribution of the vacancy-related defect (the left axis) and the carrier lifetime distribution (the right axis) corresponding to graph (a) of FIG. 8. Graph (b) of FIG. 8 shows each distribution after annealing. The vacancy-related defect density is a density distribution for the sum of vacancies (V), divacancies (VV) or the like. The vacancy-related defects are distributed around the range of helium with the highest density by implanting helium ions.

On the other hand, when the protons (hydrogen ions) at the deepest position are implanted into a shallower position than helium and heat treatment is conducted, hydrogen diffuses to a position further deeper than the range of the protons at the deepest position. With the diffused hydrogen, hydrogen terminates dangling bonds caused by vacancy-related defects due to the helium implantation. Therefore, the vacancy-related defect density of the region from the position deeper than the range of the protons at the deepest position to the proton implantation surface decreases. Furthermore, in response to the decrease of the vacancy-related defect density, the carrier lifetime is almost recovered to the value of the region where helium is not implanted.

Graph (c) of FIG. 8 is a donor concentration distribution corresponding to graph (a) of FIG. 8 and graph (b) of FIG. 8. Because the VOH defects are formed in response to hydrogen terminal at the region deeper than the range of the protons at the deepest position, a high concentration region 32 in which the concentration is higher than the phosphorous concentration of the semiconductor substrate 10 can be formed. Further, in the proton range region in which the hydrogen concentration is sufficiently high, a peak corresponding to the concentration distribution of the protons are formed.

In this way, the high concentration region 32 can be formed as with the formation of point defects by an electron beam irradiation when the vacancy-related defects due to helium are formed at a position deeper than the deepest proton range.

The implantation position of helium may coincide with an end position of the region in which the high concentration region 32 should be formed. Alternatively, the implantation position of helium may be closer to the front surface of the semiconductor substrate 10 than the end of the region in which the high concentration region 32 should be formed. In this case, in the semiconductor substrate after annealing, the defect region 46 extends closer to the front surface of the semiconductor substrate 10 than the high concentration region 32. Thereby, as shown in graph (b) of FIG. 8, many crystal defects remains in the region closer to the front surface of the semiconductor substrate 10 than the high concentration region 32. Thereby, the carrier lifetime in the aforementioned region can be regulated.

The defect region 46 may extend closer to the front surface of the semiconductor substrate 10 than the center in the depth direction of the semiconductor substrate 10. Furthermore, the defect region 46 may extend closer to the front surface of the semiconductor substrate 10 by 40 µm or more than the peak 40 of impurity concentration at the deepest position as viewed from the back surface of the semiconductor substrate 10.

Figure 9:
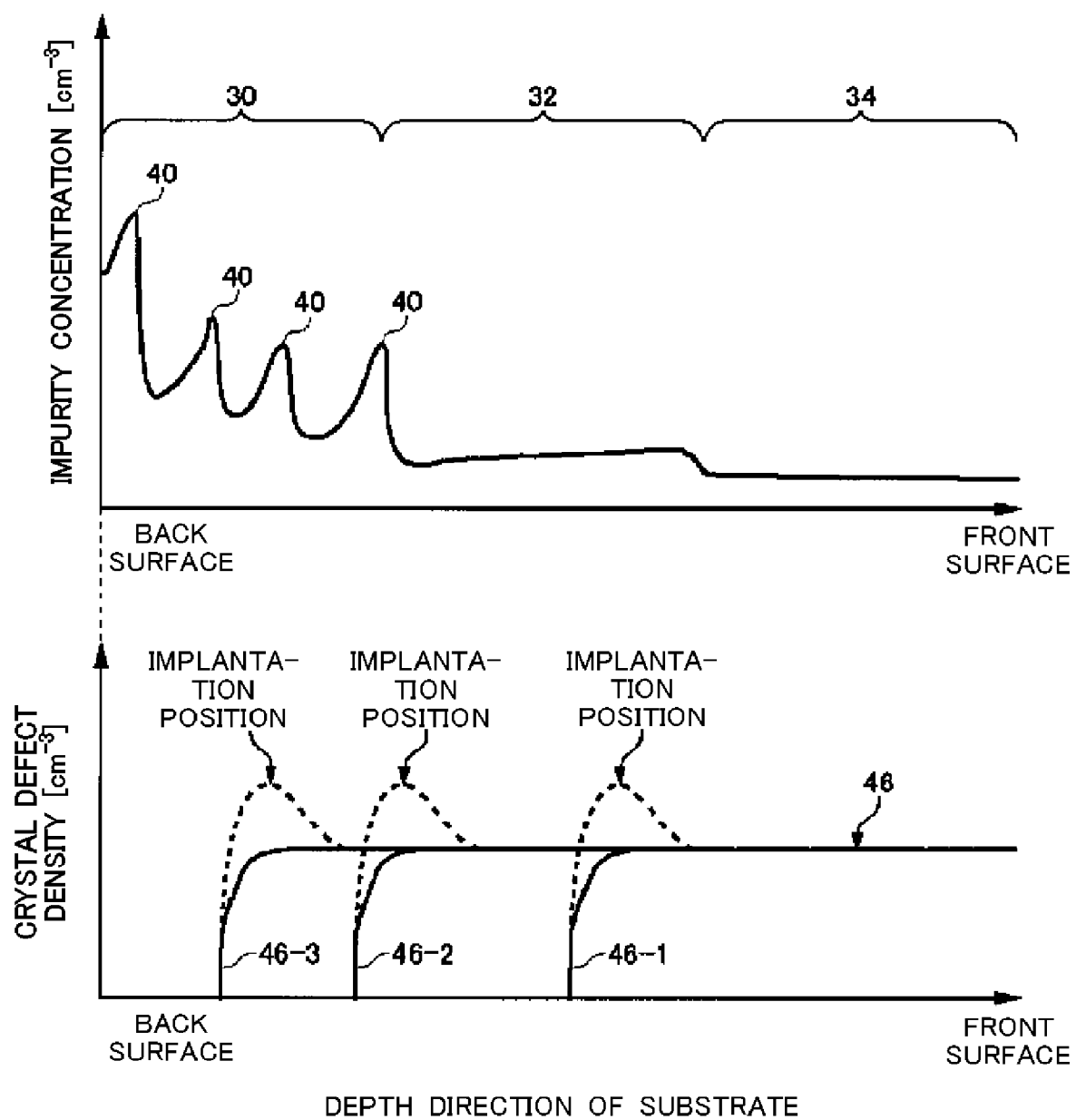
FIG. 9 shows a diagram illustrating an example in which a defect region 46 is formed by implanting helium from the front surface side of the semiconductor substrate 10.

FIG. 9 shows a diagram illustrating an example in which a defect region 46 is formed by implanting helium from the front surface side of the semiconductor substrate 10. In this case, the defect region 46 is formed in the semiconductor substrate 10 to extend in the depth direction from the front surface of the semiconductor substrate 10. In FIG. 9, three defect regions 46 of different helium implantation positions are shown.

The tip of defect region 46-1 on the back surface side of the semiconductor substrate 10 is formed within the high concentration region 32. In other words, a part of the defect region 46-1 is formed at the same position in the depth direction as a part of the high concentration region 32. Diffusion of protons are promoted in the region in which the defect region 46-1 has been formed. For this reason, the high concentration region 32 can be formed in a wider range by forming the defect region 46-1 in at least a part of the region in which the high concentration region 32 should be formed.

Note that in FIG. 9, the density of the crystal defects before diffusing protons are shown by a dotted line. Before diffusing protons, the peak of the crystal defect density exists near the implantation position of helium. However, the crystal defects are terminated by diffusing protons with heat treatment. Thereby, the peak of the crystal defect density is made gentle and leak current can be suppressed.

Furthermore, as with the defect region 46-3, the tip of the defect region 46 may extend closer to the back surface of the semiconductor substrate 10 than the peak 40 provided closest to the front surface of the semiconductor substrate 10 in the peak region 30. Thereby, the high concentration region 32 can be formed easily because the defect region 46 can be formed over the entire region in which the high concentration region 32 should be formed.

Furthermore, as with the defect region 46-2, the tip of the defect region 46 may be formed at the same position in the depth direction as any of the peaks 40 in the peak region 30. In this case, the peak of the crystal defect density near the implantation position of helium can be made gentler. For this reason, leak current can be further suppressed.

Figure 10A:
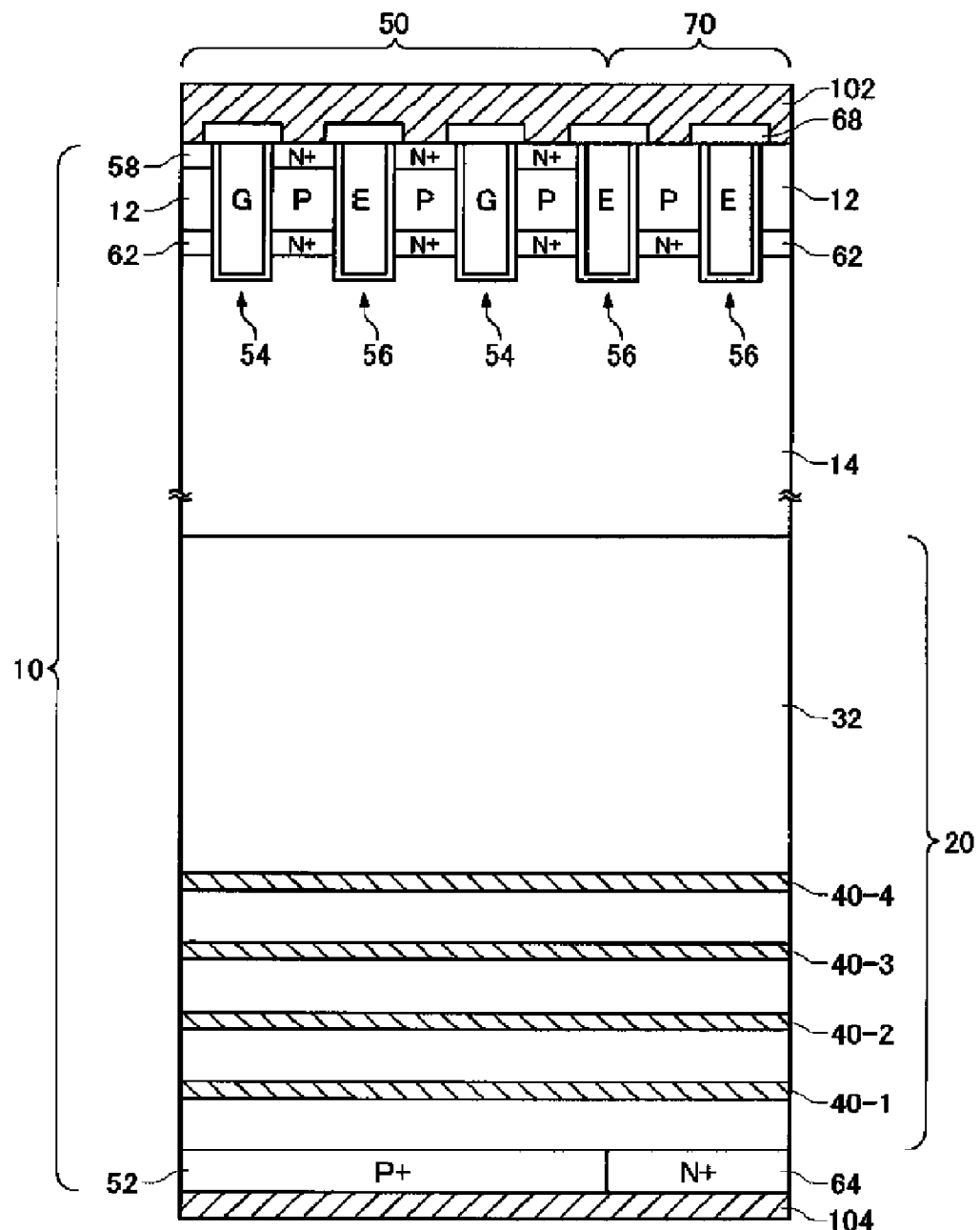
FIG. 10A shows a cross-sectional view illustrating the outline of a semiconductor device 200 according to a second embodiment of the present invention.

FIG. 10A shows a cross-sectional view illustrating the outline of a semiconductor device 200 according to a second embodiment of the present invention. A semiconductor substrate 10 of the semiconductor device 200 has a transistor region 50 in which a transistor such as an IGBT is formed, and a diode region 70 in which a diode such as a FWD is formed. In this example, the transistor region 50 and the diode region 70 are adjacent.

In the transistor region 50, an N+—type emitter region 58, a P-type front surface-side region 12 which functions as a base region, an N-type drift region 14, a FS region 20 and a P+—type collector region 52 are provided in order from the front surface side of the semiconductor substrate 10. Furthermore, an n+—type accumulation region 62 to improve IE effect may be provided between the front surface-side region 12 and the drift region 14.

A plurality of gate trenches 54 and a plurality of emitter trenches 56 which reach the drift region 14 from the front surface of the semiconductor substrate 10 can be provided in the transistor region 50. A gate electrode G to which a gate voltage is applied is formed inside the gate trench 54. An emitter electrode E electrically connected to a front surface-side electrode 102 which functions as an emitter electrode is formed inside the emitter trench 56.

A insulating film 68 is formed between the gate electrode G and the emitter electrode E, and the front surface-side electrode 102. However, a through hole to connect the emitter electrode E and the front surface-side electrode 102 is formed in a partial region of the insulating film 68.

In the diode region 70, a P-type front surface-side region 12 which functions as a base region, an N-type drift region 14, a FS region 20, and an N+—type cathode region 64 are provided in order from the front surface side of the semiconductor substrate 10. An accumulation region 62 may be formed also in the diode region 70. A peak region having a plurality of peaks 40 is formed in the FS region 20 of the transistor region 50 and the diode region 70. A plurality of emitter trenches 56 which reach the drift region 14 from the front surface of the semiconductor substrate 10 are provided in the diode region 70. Furthermore, a back surface-side electrode 104 which is in contact with the collector region 52 and the cathode region 64 is formed at the back surface of the semiconductor substrate 10.

For the semiconductor device 200 of this example, the entire semiconductor substrate 10 is irradiated with an electron beam to form a defect region. Thereby, a high concentration region 32 is formed in the transistor region 50 and the diode region 70.

Figure 10B:
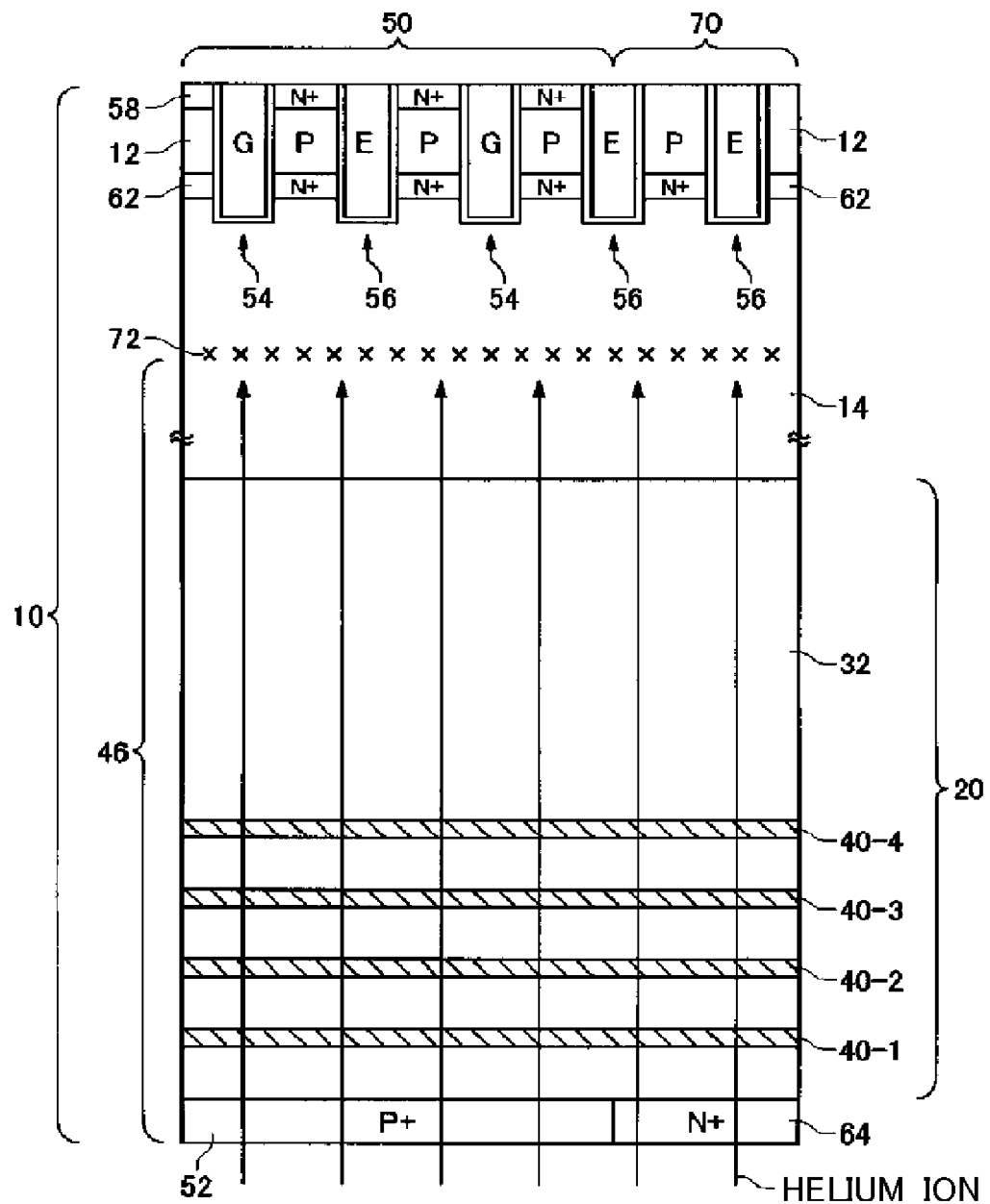
FIG. 10B shows a diagram illustrating another example of the semiconductor device 200.

FIG. 10B shows a diagram illustrating another example of the semiconductor device 200. In FIG. 10B, only the semiconductor substrate 10 is shown. For the semiconductor device 200 of this example, helium ions are implanted from the back surface side of the semiconductor substrate 10 to form the defect region. The other structures are similar to those in the semiconductor device 200 shown in FIG. 10A. Note that helium ions are implanted into the entire transistor region 50 and diode region 70 in this example. The implantation position of helium ions 72 are closer to the front surface of the semiconductor substrate 10 than the region in which the high concentration region 32 should be formed.

The defect region 46 is formed between the back surface of the semiconductor substrate 10 and the implantation position 72 by implanting helium ions from the back surface side of the semiconductor substrate 10. The semiconductor substrate 10 is annealed after forming the defect region 46 and implanting protons into the peak region 30. Thereby, the high concentration region 32 is formed in the transistor region 50 and the diode region 70.

Figure 10C:
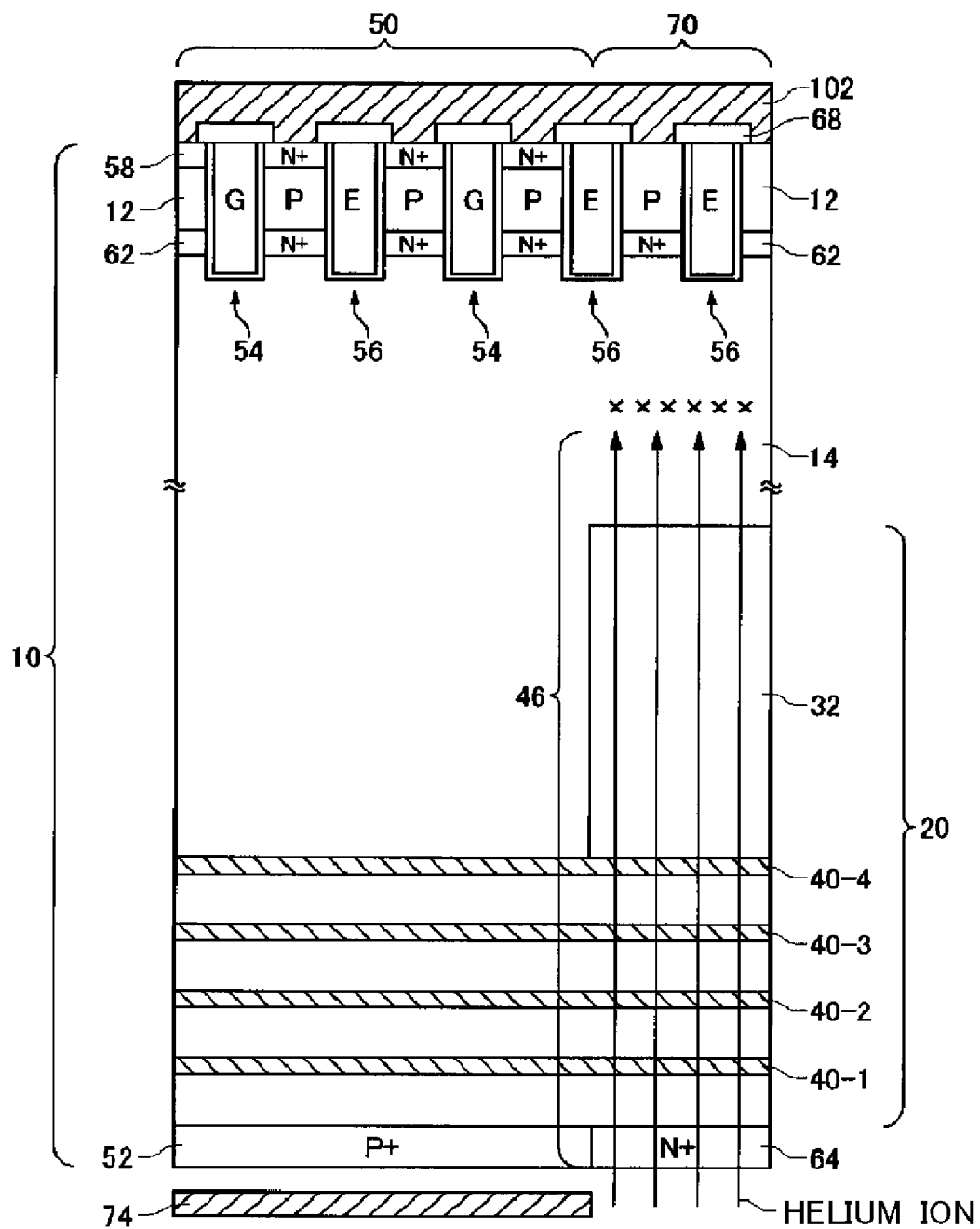
FIG. 10C shows a diagram illustrating another example of the semiconductor device 200.

FIG. 10C shows a diagram illustrating another example of the semiconductor device 200. In FIG. 10C, only the semiconductor substrate 10 is shown. For the semiconductor device 200 of this example, helium ions are implanted from the back surface side of the semiconductor substrate 10 to form the defect region. The other structures are similar to those in the semiconductor device 200 shown in FIG. 10A. Note that helium ions are implanted into the diode region 70, and helium ions are not implanted into the transistor region 50 in this example. As an example, a metal mask 74 to mask the transistor region 50 is used in the implanting helium ions. The implantation position of helium ions 72 is closer to the front surface of the semiconductor substrate 10 than the region in which the high concentration region 32 is formed.

The defect region 46 is formed between the back surface of the semiconductor substrate 10 and the implantation position 72 by implanting helium ions from the back surface side of the semiconductor substrate 10. The semiconductor substrate 10 is annealed after forming the defect region 46 and implanting protons into the peak region 30. Thereby, the high concentration region 32 is formed in the diode region 70, and the high concentration region 32 is not formed in the transistor region 50.

Figure 10D:
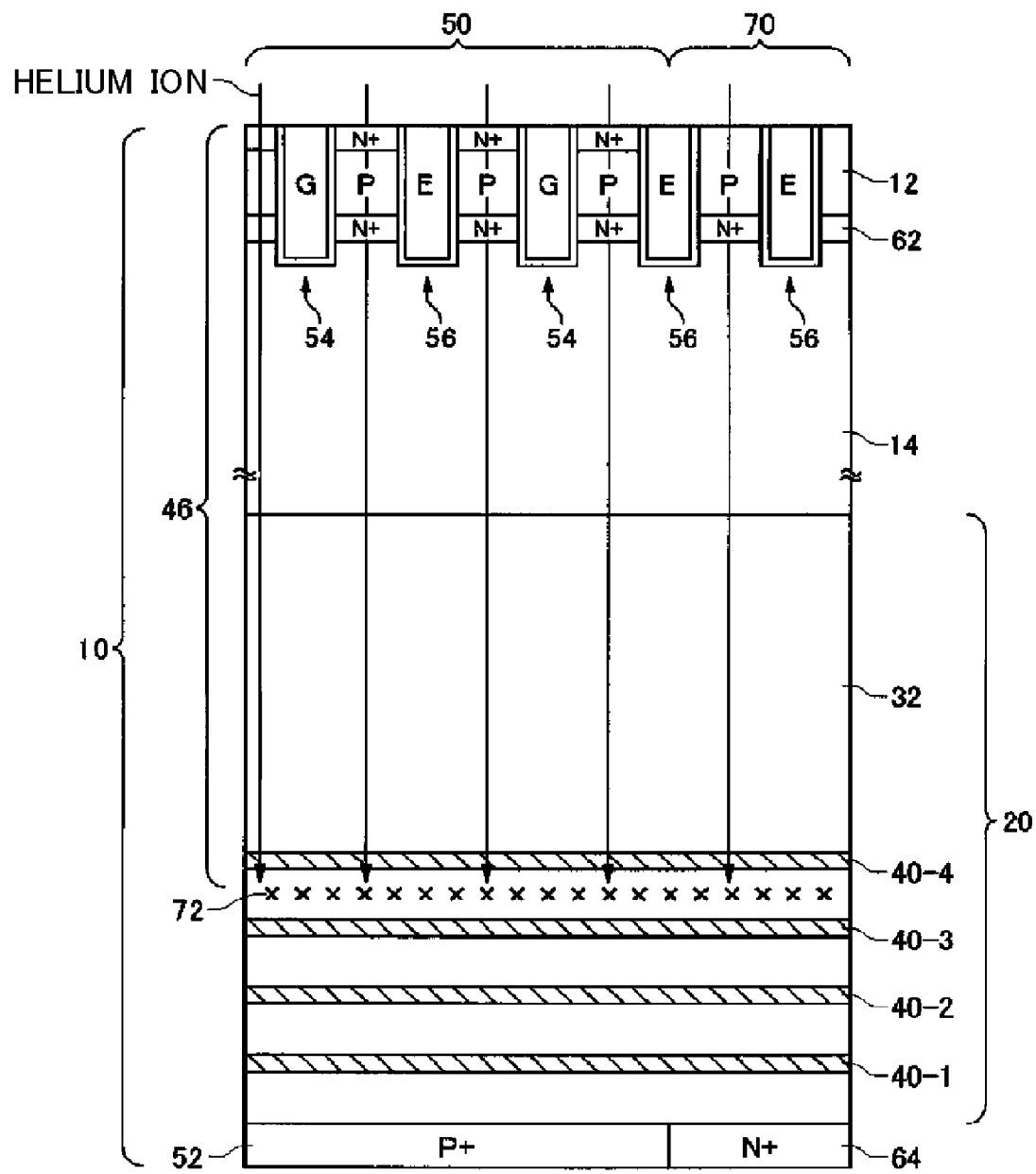
FIG. 10D shows a diagram illustrating another example of the semiconductor device 200.

FIG. 10D shows a diagram illustrating another example of the semiconductor device 200. In FIG. 10D only the semiconductor substrate 10 is shown. For the semiconductor device 200 of this example, helium ions are implanted from the front surface side of the semiconductor substrate 10 to form the defect region. The other structures are similar to those in the semiconductor device 200 shown in FIG. 10A. Note that helium ions are implanted into the entire transistor region 50 and diode region 70 in this example. The implantation position of helium ions 72 is for example, any position in the peak region 30.

The defect region 46 is formed between the front surface of the semiconductor substrate 10 and the implantation position 72 by implanting helium ions from the front surface side of the semiconductor substrate 10. The semiconductor substrate 10 is annealed after forming the defect region 46 and implanting protons into the peak region 30. Thereby, a high concentration region 32 is formed in the transistor region 50 and the diode region 70.

Figure 10E:
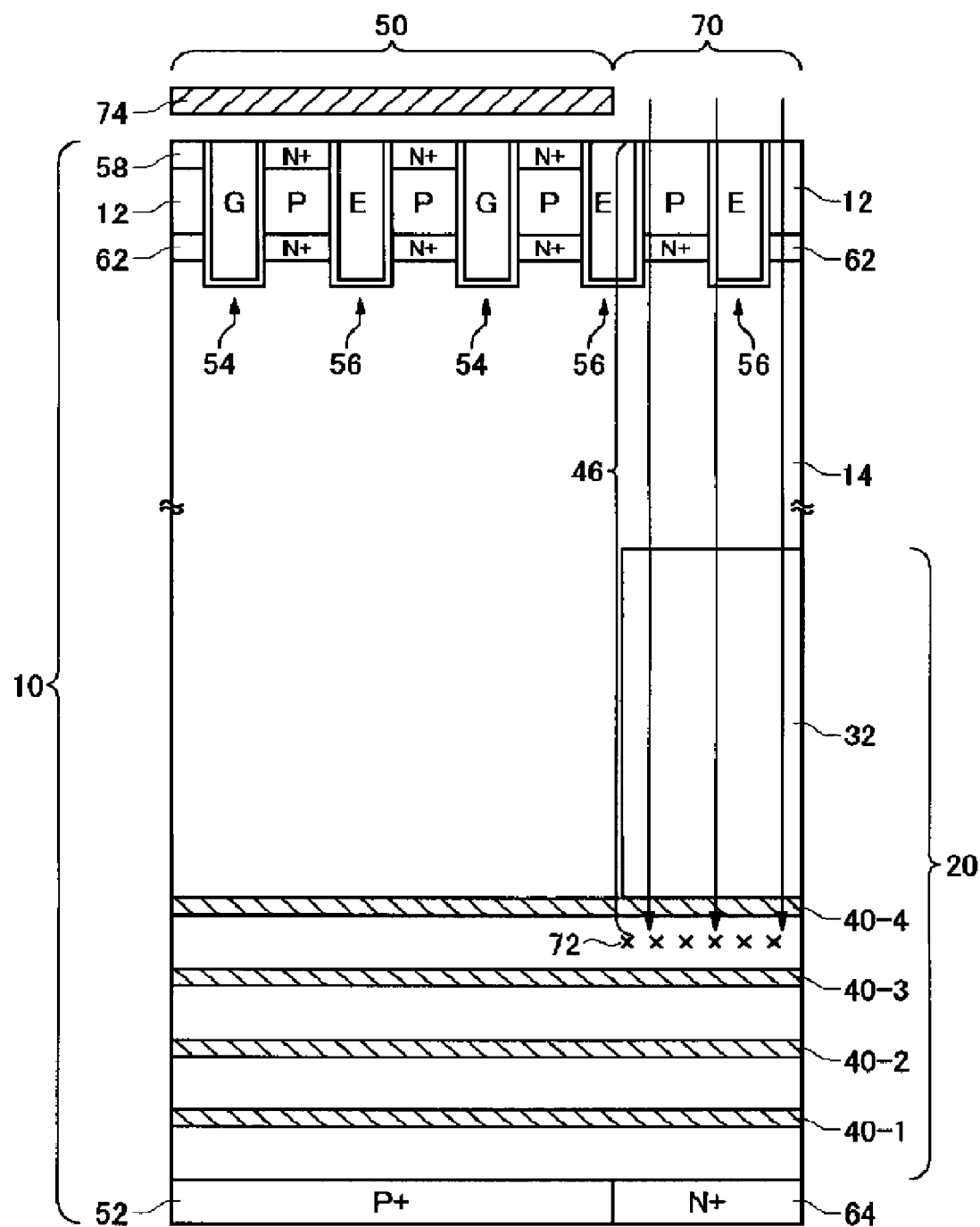
FIG. 10E shows a diagram illustrating another example of the semiconductor device 200.

FIG. 10E shows a diagram illustrating another example of the semiconductor device 200. In FIG. 10E, only the semiconductor substrate 10 is shown. For the semiconductor device 200 of this example, helium ions are implanted from the front surface side of the semiconductor substrate 10 to form the defect region. The other structures are similar to those in the semiconductor device 200 shown in FIG. 10A. Note that helium ions are implanted into the diode region 70, and helium ions are not implanted into the transistor region 50 in this example. As an example, a metal mask 74 to mask the transistor region 50 is used in the implanting helium ions. The implantation position of helium ions 72 is for example, any position in the peak region 30.

The defect region 46 is formed between the front surface of the semiconductor substrate 10 and the implantation position 72 by implanting helium ions from the front surface side of the semiconductor substrate 10. The semiconductor substrate 10 is annealed after forming the defect region 46 and implanting protons into the peak region 30. Thereby, the high concentration region 32 is formed in the diode region 70, and the high concentration region 32 is not formed in the transistor region 50.

Figure 10F:
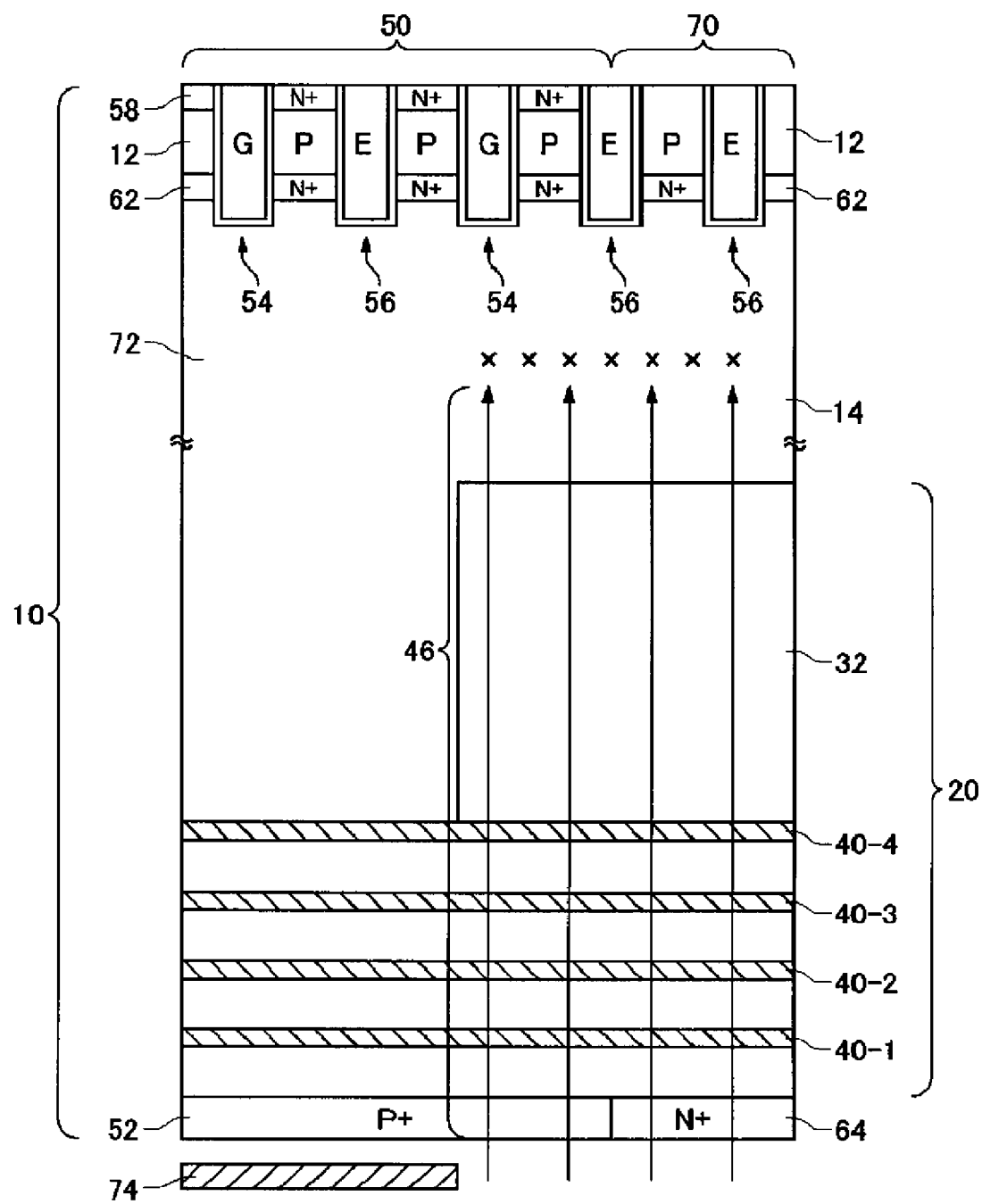
FIG. 10F shows a diagram illustrating another example of the semiconductor device 200.

FIG. 10F shows a diagram illustrating another example of the semiconductor device 200. In FIG. 10F, only the semiconductor substrate 10 is shown. For the semiconductor device 200 of this example, helium ions are implanted from the back surface side of the semiconductor substrate 10 to form the defect region. The other structures are similar to those in the semiconductor device 200 shown in FIG. 10A. Note that helium ions are implanted into the diode region 70 and a partial region of the transistor region 50 adjacent to the diode region 70, and helium ions are not implanted into a partial region of the transistor region 50 away from the diode region 70 in this example. As an example, a metal mask 74 to mask the transistor region 50 is used in the implanting helium ions. The implantation position of helium ions 72 are closer to the front surface of the semiconductor substrate 10 than the region in which the high concentration region 32 should be formed.

The defect region 46 is formed between the back surface of the semiconductor substrate 10 and the implantation position 72 by implanting helium ions from the back surface side of the semiconductor substrate 10. The semiconductor substrate 10 is annealed after forming the defect region 46 and implanting protons into the peak region 30. Thereby, the high concentration region 32 is formed in the diode region 70 and the partial region of the transistor region 50, and the high concentration region 32 is not formed in the remaining region of the transistor region 50. Note that the high concentration region 32 may be formed in the partial region of the transistor region 50 also in the semiconductor device 200 shown in FIG. 10E.

Furthermore, semiconductor substrates 10 described in FIGS. 1-10F may be MCZ (Magnetic Field Applied) substrates. The oxygen concentration of a MCZ substrate is higher than that of a FZ substrate. When the oxygen concentration is high, the quantity of VO defects is relatively increased in the semiconductor substrate 10 irradiated with an electron beam and the quantity of VV defects is relatively decreased. Because the VO defects tend to be terminated with hydrogen, protons can be easily diffused, and the high concentration region 32 can be formed up to a deep position.

Furthermore, if protons are diffused, the VO defects are terminated by the protons and become VOH defects. For this reason, the quantity of the VOH defects is larger than that of the VV defects in the MCZ substrate in which protons are diffused. A VOH defect has a shallow level compared to a VV defect, and is hard to contribute to leak current. For this reason, if protons are diffuses in the MCZ substrate, leak current can be decreased.

Figure 11:
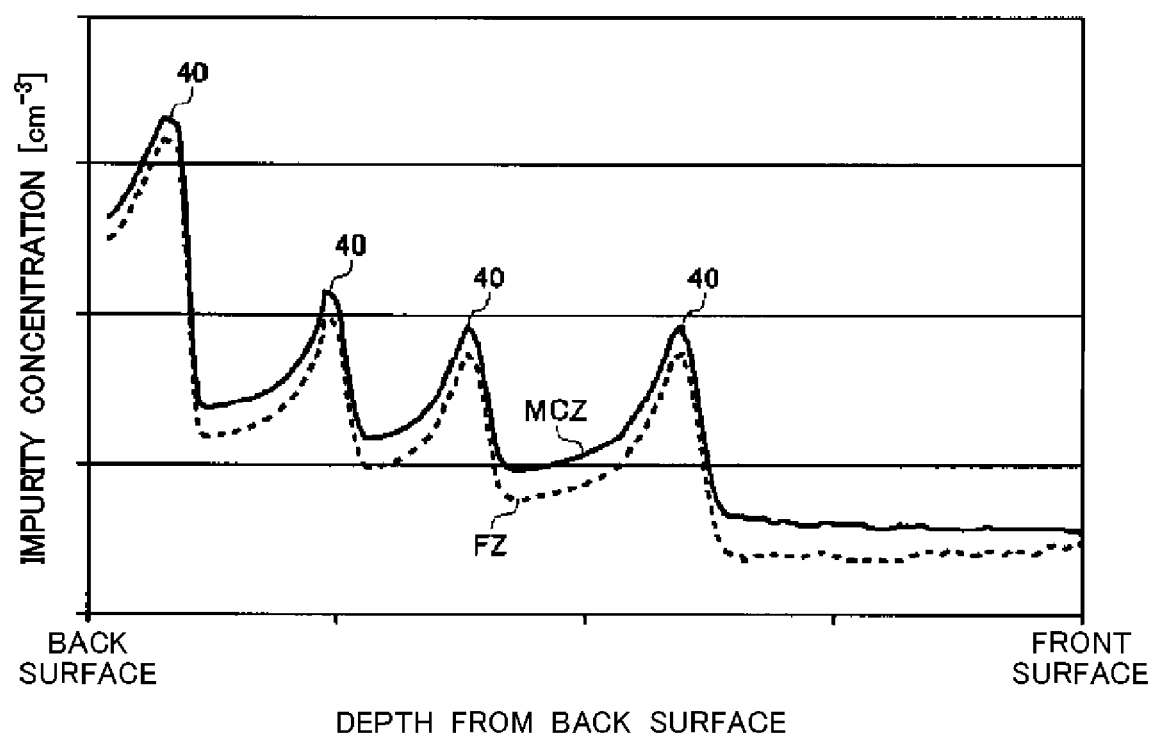
FIG. 11 shows a diagram illustrating examples of impurity concentration distributions for the case where a MCZ substrate is irradiated with an electron beam and for the case where a FZ substrate is irradiated with an electron beam.

FIG. 11 shows a diagram illustrating examples of impurity concentration distributions for the case where a MCZ substrate is irradiated with an electron beam and when a FZ substrate is irradiated with an electron beam. In this example, protons are implanted at four levels of depth, similar to the example shown in FIG. 4. The specific resistance of a substrate is the same between the example in which the MCZ substrate is used and the example in which the FZ substrate is used. Furthermore, conditions except the substrate material that are the condition for implanting protons, the condition for irradiating an electron beam or the like are the same.

As shown in FIG. 11, the impurity concentration in the region closer to the front surface than the peaks 40 of protons becomes high by using the MCZ substrate. For this reason, the high concentration region can be easily formed. Furthermore, the leak current in the semiconductor device 100 using the MCZ substrate was decreased compared to the leak current in the device using the FZ substrate. Furthermore, the leak current in the semiconductor device 100 using the MCZ substrate was decreased compared to the leak current in the example in which the MCZ substrate is irradiated with an electron beam and protons are not implanted.

Note that the semiconductor substrate 10 may be the substrate in which the average oxygen concentration is $1.0 \times 10^{16}/cm^3$ or more and $1.0 \times 10^{18}/cm^3$ or less. This also achieves the similar effect to that of the MCZ substrate. The average oxygen concentration of the semiconductor substrate 10 may be $3.0 \times 10^{16}/cm^3$ or more and $5.0 \times 10^{17}/cm^3$ or less.

Furthermore, the semiconductor substrate 10 may be the substrate in which the average carbon concentration is $1.0 \times 10^{14}/cm^3$ or more and $3.0 \times 10^{15}/cm^3$ or less. Furthermore, the semiconductor substrate 10 may be the substrate in which both of the average oxygen concentration and the average carbon concentration are within the foregoing range.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 12: front surface-side region, 14: drift region, 20: FS region, 21, 23, 110, 112: distribution, 30: peak region. 32: high concentration region, 34: low concentration region, 40: peak. 42: increase part, 44: decrease part, 46: defect region, 50: transistor region, 52: collector region, 54: gate trench, 56: emitter trench, 58: emitter region, 62: accumulation region, 64: cathode region, 68: insulating film, 70: diode region, 72: implantation position, 74: mask, 100: semiconductor device, 102: front surface-side electrode, 104: back surface-side electrode, 200: semiconductor device

What is claimed is:

1. A semiconductor device comprising:
    a semiconductor substrate doped with impurities, wherein the semiconductor substrate includes:
    a peak region arranged on the back surface side of the semiconductor substrate and having two or more peaks of donor concentration;
    a high concentration region arranged closer to a front surface than the peak region and having a gentler distribution of the donor concentration than the two or more peaks; and
    a low concentration region arranged closer to the front surface than the high concentration region and having a lower donor concentration than the high concentration region, wherein
    the peak region includes two or more peaks of hydrogen concentration corresponding to the two or more peaks of the donor concentration,
    the donor concentration of the peak region is lower than the hydrogen concentration of the peak region,
    the high concentration region has an increase part in which the donor concentration increases and the hydrogen concentration decreases from the back surface side toward the front surface side of the semiconductor substrate, and
    the hydrogen concentration of the high concentration region is lower than the hydrogen concentration of the peak that is closest to the high concentration region in the peak region.

2. The semiconductor device according to claim 1, wherein
    the high concentration region has a decrease part closer to the front surface of the semiconductor substrate than the increase part, the donor concentration of the decrease part decreasing from the back surface side toward the front surface side of the semiconductor substrate.

3. The semiconductor device according to claim 1, wherein
    the semiconductor substrate has a drift region, and
    the low concentration region is included in the drift region.

4. The semiconductor device according to claim 1, wherein
    a length in a depth direction of the high concentration region is longer than a length in a depth direction of the peak region.

5. The semiconductor device according to claim 1, wherein
    a carrier lifetime in the high concentration region is longer than a carrier lifetime in the low concentration region.

6. The semiconductor device according to claim 5, wherein
    helium is included in the low concentration region.

7. The semiconductor device according to claim 1, wherein
    helium is included between the peaks of the donor concentration in the peak region.

8. The semiconductor device according to claim 1, wherein
the semiconductor substrate has a transistor region in which a transistor is formed and a diode region in which a diode is formed,
the peak region and the high concentration region are formed in the diode region, and
the peak region is formed while the high concentration region is not formed, in the transistor region.

9. The semiconductor device according to claim 1, wherein
a length in a depth direction of the high concentration region is 5 µm or more.

10. The semiconductor device according to claim 1, wherein
the maximum value of the donor concentration in the high concentration region is larger than or equal to 1.2 times the donor concentration in the low concentration region.

11. The semiconductor device according to claim 1, wherein
the donor concentration of a peak of the two or more peaks that is closest to the front surface side is higher than $5 \times 10^{14}/cm^3$.

12. The semiconductor device according to claim 1, wherein
the semiconductor substrate is a MCZ substrate.

13. The semiconductor device according to claim 1, wherein
an average oxygen concentration in the semiconductor substrate is $1.0 \times 10^{16}/cm^3$ or more and $1.0 \times 10^{18}/cm^3$ or less.

14. The semiconductor device according to claim 1, wherein
the semiconductor substrate further has a defect region formed to extend in a depth direction from the front surface of the semiconductor substrate to the high concentration region or the peak region.

15. The semiconductor device according to claim 14, wherein
the defect region contains helium between the peaks of the donor concentration in the peak region.

16. The semiconductor device according to claim 14, wherein
the defect region contains helium at the same position in a depth direction as any of the peaks of the donor concentration in the peak region.

17. The semiconductor device according to claim 1, wherein
the semiconductor substrate further has a defect region provided from a back surface to the low concentration region, and
a tip of the defect region in a depth direction of the semiconductor substrate is arranged in the low concentration region.

18. The semiconductor device according to claim 1, wherein
a length in a depth direction of the high concentration region is 20 µm or more.

19. The semiconductor device according to claim 1, wherein
the donor concentration at a boundary between a peak of the two or more peaks that is closest to the high concentration region in the peak region and the high concentration region is higher than the donor concentration in the low concentration region.

20. The semiconductor device according to claim 1, wherein
in the peak region, a peak of the peaks of the donor concentration that is closest to the front surface side of the semiconductor substrate and a peak of the peaks of the hydrogen concentration that is closest to the front surface side of the semiconductor substrate are provided at the same position in a depth direction of the semiconductor substrate.

21. A method of manufacturing a semiconductor device comprising:
doping protons from a back surface side of a semiconductor substrate to form a peak region on a back surface side of the semiconductor substrate, wherein the peak region has two or more peaks of donor concentration and two or more peaks of hydrogen concentration corresponding to the two or more peaks of the donor concentration, and the donor concentration of the peak region is lower than the hydrogen concentration;
forming a defect region extending in a depth direction of the semiconductor substrate; and
annealing the semiconductor substrate after the doping protons and after the forming the defect region;
wherein
in the annealing the semiconductor substrate, the high concentration region is formed by diffusing hydrogen deeper than a range region of the protons doped in the doping protons, the high concentration region having an increase part in which the donor concentration increases and the hydrogen concentration decreases from the back surface side toward the front surface side, and having a hydrogen concentration lower than the hydrogen concentration of the peak that is closest to the front surface side of the semiconductor substrate in the peak region; and
the semiconductor substrate includes a lower donor concentration region than the high concentration region, the lower donor concentration region being arranged closer to the front surface than the high concentration region.

22. The method of manufacturing a semiconductor device according to claim 21, wherein
in the annealing the semiconductor substrate, the high concentration region having a decrease part closer to the front surface of the semiconductor substrate than the increase part is formed, and the donor concentration of the decrease part decreasing from the back surface side toward the front surface side of the semiconductor substrate.

23. The method of manufacturing a semiconductor device according to claim 21, wherein
in the forming the defect region, helium is implanted to the semiconductor substrate.

24. The method of manufacturing a semiconductor device according to claim 21, wherein
in the forming the defect region, the semiconductor substrate is irradiated with an electron beam of between 20 kGy and 1500 kGy.

25. The method of manufacturing a semiconductor device according to claim 21, wherein
in the forming the defect region, the defect region is formed to extend from the front surface of the semiconductor substrate or the back surface of the semiconductor substrate to an implantation position of a defect generating substance by implanting the defect generating substance at a predetermined depth of the semiconductor substrate from the front surface of the semiconductor substrate or the back surface of the semiconductor substrate.

26. The method of manufacturing a semiconductor device according to claim 25, wherein the semiconductor substrate has a transistor region in which a transistor is formed and a diode region in which a diode is formed, and in the forming the defect region, at least a part of the transistor region is masked to implant the defect generating substance.

27. The method of manufacturing a semiconductor device according to claim 26, wherein the peak region and the high concentration region are formed in the diode region, and the peak region is formed while the high concentration region is not formed, in the transistor region.

28. The method of manufacturing a semiconductor device according to claim 21, wherein a doping amount of the protons is $1.0 \times 10^{14}/\text{cm}^2$ or more.

* * * * *